(12) United States Patent
Hiramatsu

(10) Patent No.: US 7,875,206 B2
(45) Date of Patent: *Jan. 25, 2011

(54) LUMINESCENT MATERIAL

(75) Inventor: Ryosuke Hiramatsu, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 668 days.

This patent is subject to a terminal disclaimer.

(21) Appl. No.: 11/774,077

(22) Filed: Jul. 6, 2007

(65) Prior Publication Data
US 2008/0185956 A1  Aug. 7, 2008

(30) Foreign Application Priority Data
Feb. 1, 2007  (JP)  ............... 2007-023224

(51) Int. Cl.
*C09K 11/79* (2006.01)
(52) U.S. Cl. ............... 252/301.4 F; 313/503; 257/98
(58) Field of Classification Search ........... 252/301.4 F; 313/503; 257/98
See application file for complete search history.

(56) References Cited

U.S. PATENT DOCUMENTS

| | | | | | |
|---|---|---|---|---|---|
| 4,963,787 | A | * | 10/1990 | Verlijsdonk et al. | ......... 313/486 |
| 7,498,736 | B2 | * | 3/2009 | Hiramatsu et al. | ......... 313/503 |
| 2008/0018234 | A1 | | 1/2008 | Hiramatsu et al. | |
| 2009/0127507 | A1 | | 5/2009 | Hiramatsu et al. | |

FOREIGN PATENT DOCUMENTS

| | | |
|---|---|---|
| CN | 1851918 | 12/2008 |
| JP | 2003-306674 | 10/2003 |
| JP | 2005-277441 | 10/2005 |
| JP | 2006-080565 | 3/2006 |
| WO | 2004056939 | 7/2004 |
| WO | WO 2004097949 | * 11/2004 |

OTHER PUBLICATIONS

Japanese Office Action mailed on Dec. 9, 2008 corresponding to U.S. Appl. No. 11/774,077, filed Jul. 6, 2007.
Shionoya et al, Phosphor Handbook, Phosphor Research Society, CRC Press, May 1998 pp. 195-196.

* cited by examiner

*Primary Examiner*—C. Melissa Koslow
(74) *Attorney, Agent, or Firm*—Turocy & Watson, LLP

(57) ABSTRACT

A luminescent material is provided, which includes a compound having a composition represented by the following general formula (A):

$$(Sr_{a1},Ba_{b1},Ca_{c1},Re_{v1},Eu_{w1})_2SiO_4 \quad (A)$$

wherein, Re is at least one selected from a group consisting of Pr and Dy, and a1, b1, c1, v1 and w1 satisfy following relationships:

$$a1+b1+c1+v1+w1=1 \quad (1),$$

$$0 \leq a1/(1-v1-w1) \leq 1 \quad (2),$$

$$0 \leq b1/(1-v1-w1) \leq 1 \quad (3),$$

$$0 \leq c1/(1-v1-w1) \leq 1 \quad (4),$$

$$0 < v1 \leq 0.15 \quad (5),$$

$$0 < w1 \leq 0.02 \quad (6).$$

4 Claims, 13 Drawing Sheets

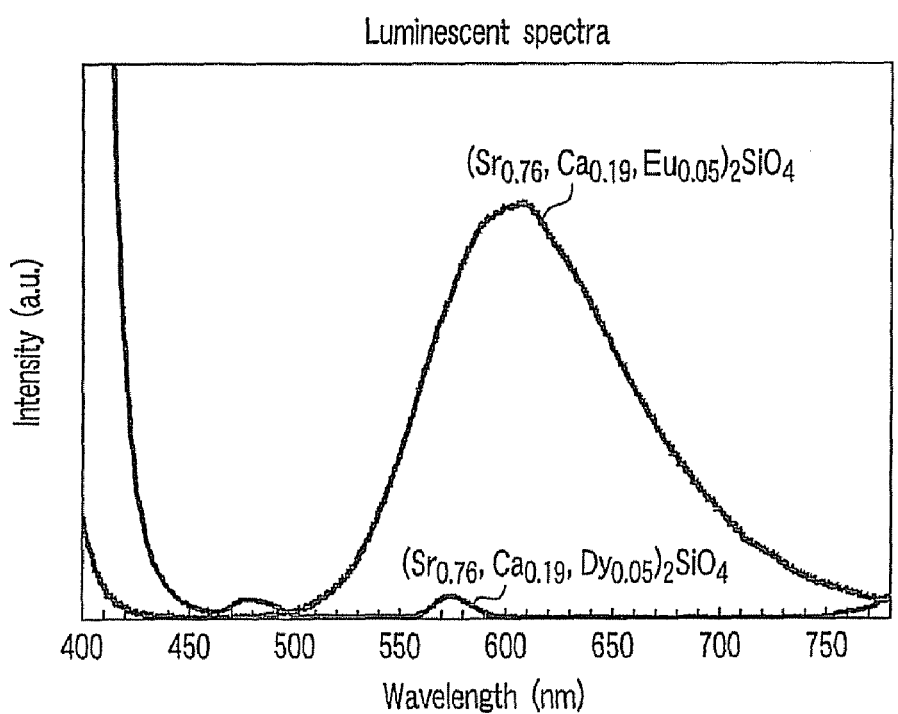
F I G. 1
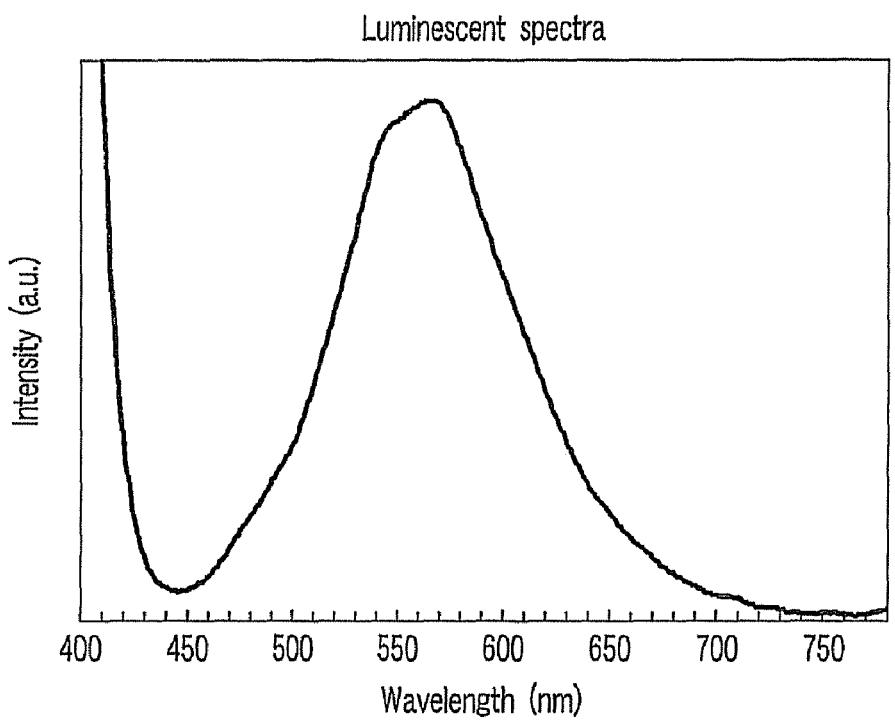
F I G. 2

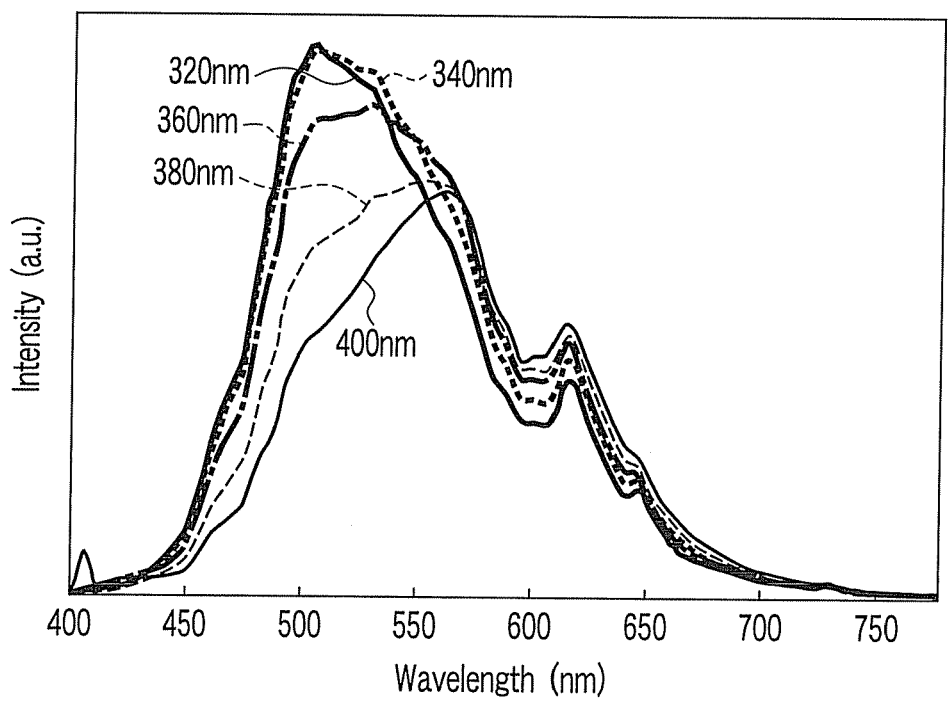
F I G. 15
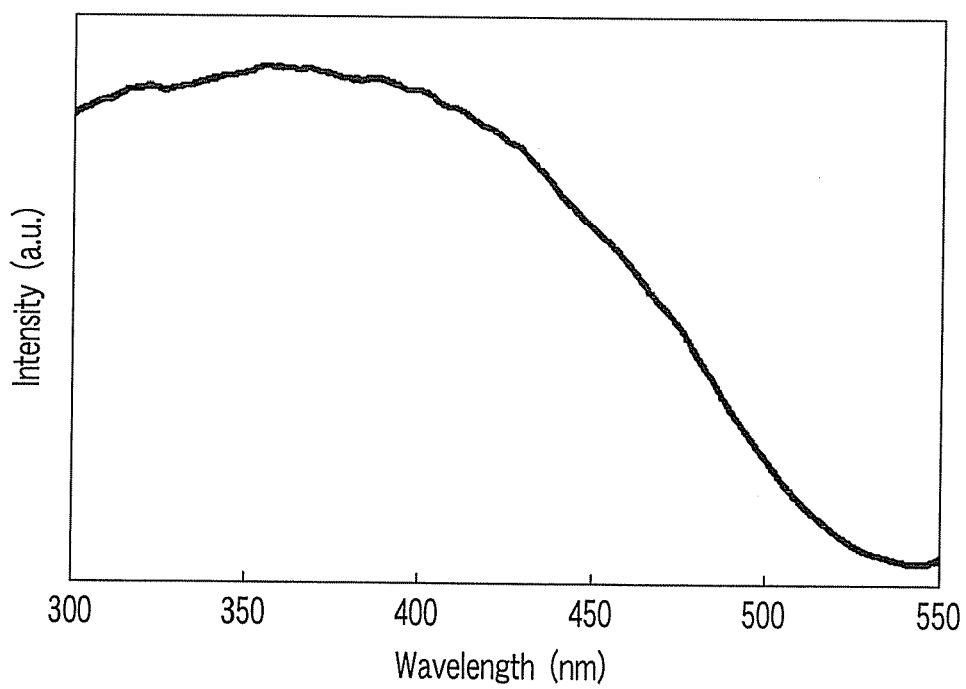
F I G. 16

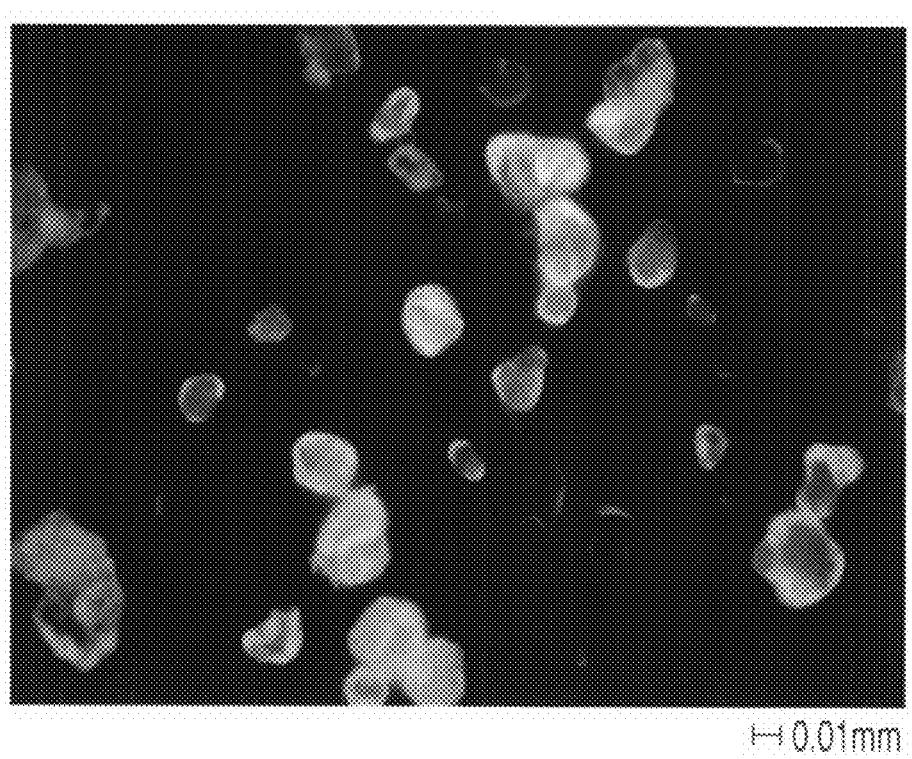
F I G. 17

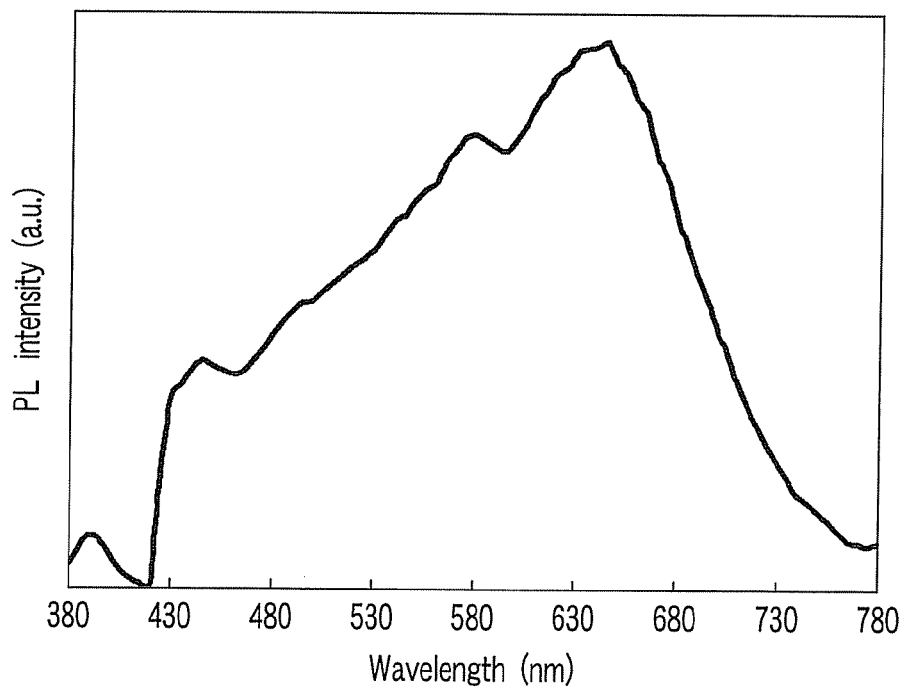
F I G. 22
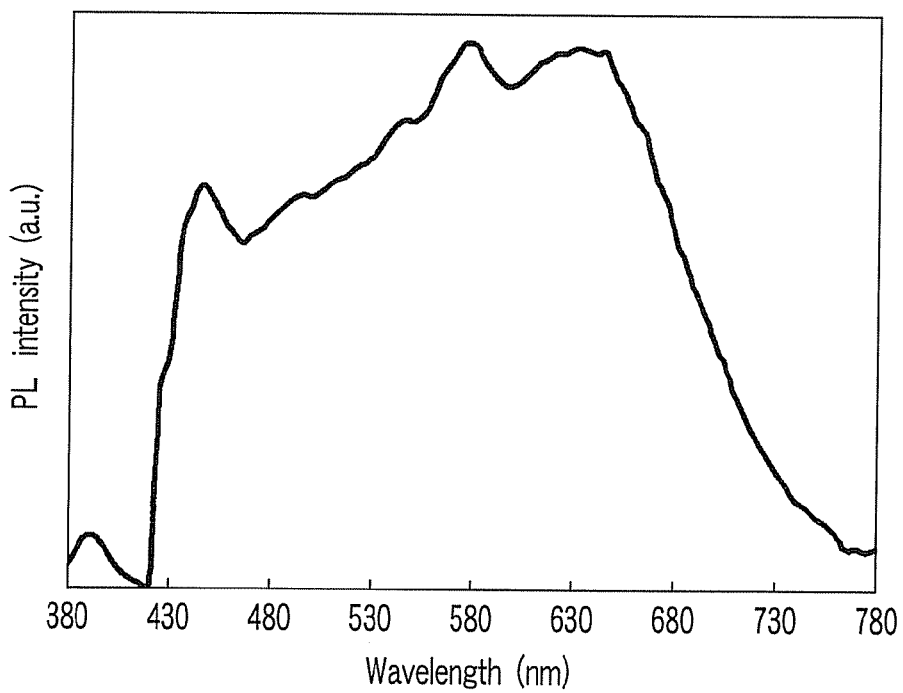
F I G. 23

LUMINESCENT MATERIAL

CROSS-REFERENCE TO RELATED APPLICATIONS

This application is based upon and claims the benefit of priority from prior Japanese Patent Application No. 2007-023224, filed Feb. 1, 2007, the entire contents of which are incorporated herein by reference.

BACKGROUND OF THE INVENTION

1. Field of the Invention

This invention relates to a luminescent material, a method of manufacturing the luminescent material, and a light-emitting device.

2. Description of the Related Art

A light-emitting diode (LED) is constituted by a combination of an LED chip a light source for excitation and a luminescent material and is enabled to emit various colors depending on this combination. In the case of a white LED which is enabled to emit white light, there is employed a combination of an LED chip with a luminescent material. For example, there is employed a combination of an LED chip emitting mainly a light of blue region with a yellow luminescent material. There is also employed a combination of an LED chip emitting a light of ultraviolet or near-ultraviolet region with a mixture of luminescent materials. This mixture of luminescent materials is composed of a blue luminescent material which emits luminescence of blue color, a green-yellow luminescent material which emits luminescence of green-yellow color, and a red luminescent material which emits luminescence of red color. The luminescent material to be used in a white LED is required to be not only capable of effectively absorbing the light ranging from near-ultraviolet region to blue region (310-420 nm) which corresponds to the emission wavelength of LED chip acting as an excitation light source but also capable of efficiently emitting visible light.

There has been proposed a white LED wherein a bivalent europium-activated alkaline earth orthosilicate luminescent material is employed. This luminescent material has a composition represented by $(Sr, Ba, Ca)_2SiO_4:Eu$ and is capable of emitting a light having an optional peak wavelength that can be realized by changing the content of the alkaline earth metal element. However, since the white LED of this kind is employed in combination with a luminescent material having a broad-band emission spectrum with a half band width of 80 nm or more, the white LED is limited in color rendering.

Further, there has been also proposed a Dy-activated luminescent material. However, since the luminescent material of this kind can be hardly excited by the light ranging from an ultraviolet region to a blue region and since $Dy^{3+}$ of the Dy-activated luminescent material is generally incapable of exhibiting an excitation band in a region ranging from an ultraviolet region to a blue region, the luminescent material is designed to be excited not by the light ranging from an ultraviolet region to a blue region but by vacuum ultraviolet rays or electron beam.

BRIEF SUMMARY OF THE INVENTION

A luminescent material according to one aspect of the present invention comprises a compound having a composition represented by a following general formula (A):

$$(Sr_{a1},Ba_{b1},Ca_{c1},Re_{v1},Eu_{w1})_2SiO_4 \quad (A)$$

wherein, Re is at least one selected from a group consisting of Pr and Dy; and a1, b1, c1, v1 and w1 satisfy following relationships:

$$a1+b1+c1+v1+w1=1 \quad (1);$$

$$0 \leq a1/(1-v1-w1) \leq 1 \quad (2);$$

$$0 \leq b1/(1-v1-w1) \leq 1 \quad (3);$$

$$0 \leq c1/(1-v1-w1) \leq 1 \quad (4);$$

$$0 < v1 \leq 0.15 \quad (5);$$

$$0 < w1 \leq 0.02 \quad (6).$$

A luminescent material according to another aspect of the present invention comprises a compound having a composition represented by a following general formula (B):

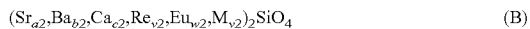

wherein, Re is at least one selected from a group consisting of Pr and Dy; M is at least one selected from a group consisting of Li, Na, K, Rb and Cs; and a2, b2, c2, v2 and w2 satisfy following relationships:

$$a2+b2+c2+2v2+w2=1 \quad (7);$$

$$0 \leq a2/(1-2v2-w2) \leq 1 \quad (8);$$

$$0 \leq b2/(1-2v2-w2) \leq 1 \quad (9);$$

$$0 \leq c2/(1-2v2-w2) \leq 1 \quad (10);$$

$$0 < v2 \leq 0.15 \quad (11);$$

$$0 < w2 \leq 0.02 \quad (12).$$

A method for manufacturing a luminescent material according to one aspect of the present invention comprises heating a raw material in a reducing atmosphere constituted by $N_2/H_2$ or $Ar/H_2$ to obtain a primary sintered product; pulverizing the primary sintered product to obtain a pulverized primary sintered product; housing the pulverized primary sintered product into a container; arranging the container housing the pulverized primary sintered product to a furnace; substituting an atmosphere in the furnace with an inert gas; and heating the pulverized primary sintered product in a reducing atmosphere constituted by $N_2/H_2$ or $Ar/H_2$ containing hydrogen at a concentration of 5% or more and less than 100% to obtain a secondary sintered product.

A light-emitting device according to one aspect of the present invention comprises a light-emitting element emitting light, the light having a main light emission peak in a wavelength ranging from 310 to 420 nm; and a luminescent layer comprising a luminescent material configured to be irradiated with the light, at least part of the luminescent material being the above-mentioned luminescent material.

BRIEF DESCRIPTION OF THE SEVERAL VIEWS OF THE DRAWING

FIG. 1 is a light-emitting spectrum of a conventional luminescent material;

FIG. 2 is a light-emitting spectrum of the luminescent material according to one embodiment;

FIG. 15 is a light-emitting spectrum of the luminescent material according to another embodiment;

FIG. 16 is an excitation spectrum of the luminescent material according to another embodiment;

FIG. 17 is a microphotograph by 365 nm excitation of the luminescent material according to another embodiment;

FIG. 22 is a light-emitting spectrum of the white LED according to one embodiment;

FIG. 23 is a light-emitting spectrum of the white LED according to another embodiment;

DETAILED DESCRIPTION OF THE INVENTION

Figure 3:
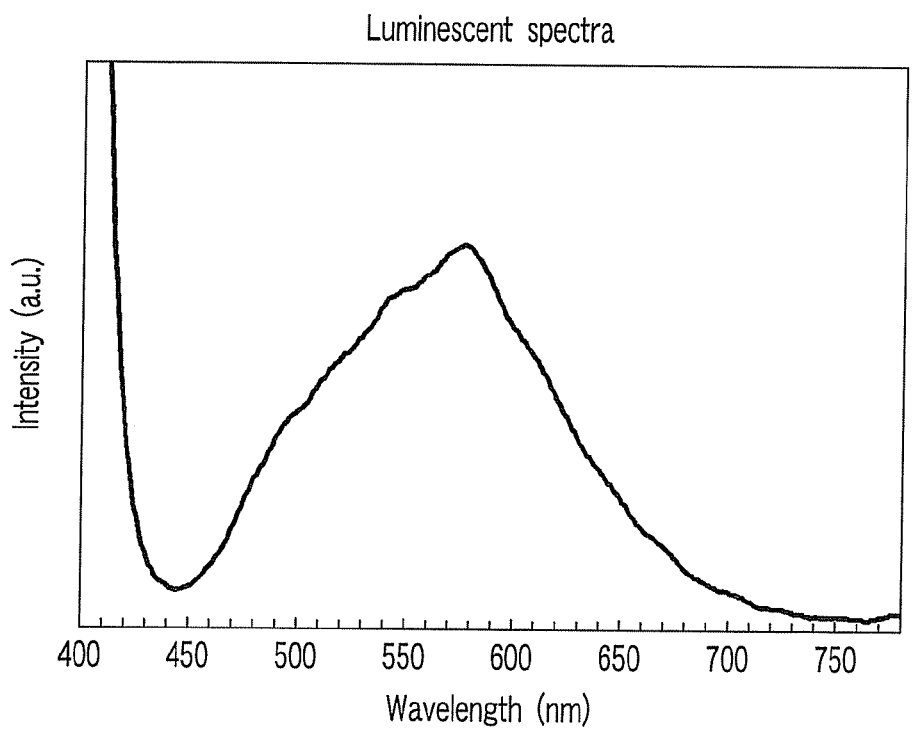
FIG. 3 is a light-emitting spectrum of the luminescent material according to another embodiment.

Next, embodiments will be explained. The embodiments described below are simply examples of the luminescent materials and the light-emitting devices each embodying the technical concept of the present invention, so that the present invention should not be construed as being limited to following embodiments.

Further, the members described in the claims accompanied herewith should not be construed as being limited to those described in the following embodiments. Unless specified otherwise, the dimensions, specific materials, configurations and relative arrangement of the constituent members described in the following embodiments are set forth merely for the purpose of explanation and hence should not be construed as limiting the scope of the present invention. Incidentally, the size and relative position of the members shown in the drawings are exaggerated in some cases for the convenience of explanation. In the following explanations, the same or like members are identified by the same designation or the same symbol, thereby omitting the repetition of detailed explanation thereof. Further, each of elements constituting the present invention may be modified in such a manner that a plurality of elements are integrated using the same and single member to enable this single member to have the functions of the plurality of elements or, to the contrary, the functions of a single member are shared using a plurality of members.

As a result of extensive studies made by the present inventors, it has been found that a luminescent material comprising an alkaline earth orthosilicate compound as a main crystal phase and a specific kind of activator is capable of emitting light as it is excited by the light having a main luminescence peak falling within a wave range of 310 to 420 nm. More specifically, this luminescent material is featured in that it comprises $(Sr, Ba, Ca)_2SiO_4$ as an alkaline earth orthosilicate compound, a first activator composed of europium (Eu), and a second activator composed of at least one of praseodymium (Pr) and dysprosium (Dy). Further, the content of each of these elements to be included in this luminescent material is optimized by the present inventors to make it possible to realize desirable emission properties.

Incidentally, the reasons for regulating the excitation wavelength so as to confine it to a region ranging from 310 to 420 nm are as explained below. Namely, the ultraviolet light-emitting LED that can be excited by a light having a wavelength of less than 310 nm is not only more expensive in manufacturing cost as compared with the LED chip that is enabled to emit the light at a region ranging from 310 to 420 nm but also low in conversion efficiency of electricity to the light. On the other hand, in the case of the LED which is designed to be excited by a light having a wavelength exceeding 420 nm, it is impossible to sufficiently secure the emission spectrum of the first activator and the emission spectrum of the second activator.

When the luminescent material according to this embodiment is excited using the light having a main luminescence peak falling within a wavelength ranging from 310 to 420 nm, a narrowband light-emitting spectrum and a broadband light-emitting spectrum are respectively enabled to be exhibited at a specific wavelength region. This narrowband light-emitting spectrum means a spectrum which is characterized by a narrowband emission where a half band width of emission spectrum as measured is not more than 60 nm. Whereas, the broadband light-emitting spectrum means a spectrum which is characterized by a broadband emission where a half band width of emission spectrum as measured is not less than 80 nm. The emission spectrum can be obtained by measuring it using a spectrophotometer such for example as IMUC-7000G (Ohtsuka Denshi Co., Ltd.) wherein a luminescent material is excited by an LED emitting the light ranging from a blue zone to a near-ultraviolet zone.

The broadband light-emitting spectrum is enabled to appear in a wavelength region ranging from 500 to 600 nm. This is an emission band resulting from the luminescence due to the f-d transition of europium employed as the first activator. Based on the fact that the emission spectrum of an europium-activated alkaline earth orthosilicate compound which is activated only with europium without the second activator being included therein is enabled to appear in a wavelength region ranging from 500 to 600 nm, it was possible to determine the wavelength region of the broadband light-emitting spectrum.

The narrowband light-emitting spectrum is an emission band resulting from the luminescence due to the transition of the second activator and hence the wavelength region varies depending on the kind of element. For example, in the case of dysprosium, the main narrowband light-emitting spectrum thereof is enabled to appear in a wavelength region ranging from 565 to 580 nm due to $^4F_{9/2} \rightarrow {}^6H_{13/2}$ transition. This emission band is the luminescence resulting from the 4f-4f transition that is shielded from the outside, so that the luminescence is not influenced so much by surrounding environments such as the constituent elements and the crystal structure of luminescent material. The peak of the narrowband light-emitting spectrum is enabled to appear in a wavelength region ranging from 565 to 580 nm as it takes a value which is inherent to the dysprosium ion.

In the case of praseodymium, the main narrowband light-emitting spectrum thereof is enabled to appear in a wavelength region ranging from 500 to 520 nm due to $^3P_0 \rightarrow ^3H_4$ transition. This emission band is the luminescence resulting from the 4f-4f transition that is shielded from the outside. Therefore, the luminescence is not influenced so much by surrounding environments such as the constituent elements and the crystal structure of luminescent material, thereby enabling it take a value which is inherent to the praseodymium ion. Further, since the absorption band which is inherent to praseodymium ion is existed in the vicinity of 600 nm, the emission spectrum would become one where part of the broadband light-emitting spectrum is absorbed therein.

When both of dysprosium and praseodymium are included as the second activator in the compound, the main narrowband light-emitting spectrum thereof is enabled to appear in a wavelength region ranging from 500 to 520 nm due to $^3P_0 \rightarrow ^3H_4$ transition. The reason for this can be explained as follows. Although it may be conceivable that the emission spectrum appearing in a wavelength region ranging from 565 to 580 nm is generated due to $^4F_{9/2} \rightarrow ^6H_{13/2}$ transition of dysprosium, the absorption band which is inherent to praseodymium ion exist in the vicinity of 600 nm. Because of this, the narrowband light-emitting of dysprosium is absorbed, whereby only the narrowband light-emitting spectrum originating from praseodymium is enabled to be confirmed.

The luminescent material according to this embodiment can be defined as capable of exhibiting both of a narrowband light-emitting spectrum and a broadband light-emitting spectrum in a specific wavelength region as it is excited by a light having a peak wavelength in a region ranging from near-ultraviolet region to blue region. Moreover, this luminescent material is constituted not by a mixture of two or more kinds of materials but by a substance having a single composition comprising a main crystal phase and activators.

The luminescent material according to this embodiment which contains specific kinds of activators as described above has a composition represented by the following general formula (A):

$$(Sr_{a1}, Ba_{b1}, Ca_{c1}, Re_{v1}, Eu_{w1})_2 SiO_4 \quad (A)$$

wherein, Re is at least one selected from a group consisting of Pr and Dy; and a1, b1, c1, v1 and w1 satisfy following relationships:

$$a1+b1+c1+v1+w1=1 \quad (1);$$

$$0 \leq a1/(1-v1-w1) \leq 1 \quad (2);$$

$$0 \leq b1/(1-v1-w1) \leq 1 \quad (3);$$

$$0 \leq c1/(1-v1-w1) \leq 1 \quad (4);$$

$$0 < v1 \leq 0.15 \quad (5);$$

$$0 < w1 \leq 0.02 \quad (6).$$

In the alkaline earth orthosilicate compound, Se, Ca and Ba exist in a completely solid-solubilized state. The ranges of the values a1, b1 and c1 all related to the contents of alkaline earth metals can be determined according to the aforementioned condition and according to the aforementioned numeric formulas (1), (5) and (6). Namely, the aforementioned numeric formulas (2), (3) and (4) can be derived according to these conditions.

Further, if any one of the values of: a1/(1−v1−w1), b1/(1−v1−w1) and c1/(1−v1−w1) exceeds one, the resultant luminescent material would become one which falls out of the stoichiometric composition ratio of $(Sr_{a1}, Ba_{b1}, Ca_{c1}, Re_{v1}, Eu_{w1})_2 SiO_4$ luminescent material. Because of this, the light-emitting efficiency may be degraded. More preferably, the composition should be such that the value of b1/(1−v1−w1) is less than 0.3 and the value of c1/(1−v1−w1) is not more than 0.9. When the composition of the luminescent material is formulated in this manner, it is advantageous in that the narrowband light-emitting spectrum would become larger in peak.

The luminescent material according to this embodiment contains a first activator (i.e., Eu) and a second activator (i.e., Re) formed of Pr and/or Dy. Therefore, the values of v1 and w1 in the aforementioned general formula (A) are both required to be larger than 0. For example, if Dy is employed as the second activator, it is possible to obtain the luminescence having a wavelength region ranging from 565 to 580 nm and originating from $Dy^{3+}$ as it is excited by a light having a main light emission peak falling within the range of 310 to 420 nm as described above.

In other words, when Eu is employed as the second activator without Dy being included therein (v1=0), only the broadband light-emission of $Eu^{2+}$ can be obtained as it is excited by a light having a main light emission peak falling within the range of 310 to 420 nm. Whereas, when Dy is employed as the second activator without Eu being included therein (w1=0), the luminescence having a wavelength region ranging from 565 to 580 nm and originating from $Dy^{3+}$ would be extremely minimized as it is excited by a light having a main light emission peak falling within the range of 310 to 420 nm. Therefore, in order to obtain the luminescence having a wavelength region ranging from 565 to 580 nm, not only Dy but also Eu is an essential activator.

In the case where Eu is employed as the second activator without Pr being included therein (v1=0) also, only the broadband light-emission of $Eu^{2+}$ can be obtained as it is excited by a light having a main light emission peak falling within the range of 310 to 420 nm. Whereas, when Pr is employed as the second activator without Eu being included therein (w1=0), the luminescence having a wavelength region ranging from 500 to 520 nm and originating from $Pr^{3+}$ would be extremely minimized as it is excited by a light having a main light emission peak falling within the range of 310 to 420 nm. Therefore, in order to obtain the luminescence having a wavelength region ranging from 500 to 520 nm, not only Eu but also Pr is an essential activator.

When the content of the second activator Re is excessive, a concentration quenching phenomenon may generate, thus weakening the light intensity of the $(Sr_{a1}, Ba_{b1}, Ca_{c1}, Re_{v1}, Eu_{w1})_2 SiO_4$ luminescent material. Namely, the luminescence having a predetermined wavelength region and originating from the second activator Re may not be obtained as it is hidden by the broadband light-emitting spectrum of $Eu^{2+}$. In order to obviate such a problem, the upper limit of the content (v1) of the second activator Re should be confined to 0.15. Preferably, the value of v1 should be confined within the range of $0 < v1 \leq 0.1$.

On the other hand, when the content of the first activator Eu is excessive, the band emission of $Eu^{2+}$ may be excessively increased, thus weakening the light intensity of the second activator Re in the $(Sr_{a1}, Ba_{b1}, Ca_{c1}, Re_{v1}, Eu_{w1})_2SiO_4$ luminescent material. As a result, the luminescence having a narrowband light-emitting spectrum in a predetermined wavelength region and originating from the second activator may not be obtained as it is hidden by the emission originating from $Eu^{2+}$. In order to obviate such a problem, the upper limit of the content (w1) of the first activator Eu should be confined to 0.02. Preferably, the value of w1 should be confined within the range of $0 < w1 \leq 0.01$.

Further, in order to efficiently derive the narrowband light-emitting of the second activator Re without the narrowband light-emitting of the second activator Re being hindered by the broad-band emission of the first activator Eu, it is preferable that the Re-activating quantity is larger than the Eu-activating quantity. For example, if the value of v1/w1 is confined to the range of about 1-50, the effect of the second activator Re can be more effectively exhibited. More preferably, the value of v1/w1 should be confined to the range of about 2-20.

In the luminescent material having a composition represented by the aforementioned general formula (A), the second activator Re is existed substituting for the site constituted by a bivalent positive ion such as calcium, strontium, barium, etc. This second activator Re is brought into a characteristic trivalent state on the occasion of narrowband emission. The second activator Re which is brought into a trivalent state, i.e., together with $Dy^{3+}$ and $Pr^{3+}$, will be represented herein by $Re^{3+}$. On the occasion of incorporating the second activator Re, a monovalent positive ion may be concurrently incorporated as compensation of charge in order to enable the aforementioned bivalent site to be easily substituted by a trivalent ion. As the element which is capable of generating a monovalent positive ion, it is possible to employ lithium, sodium, potassium, rubidium, cesium, copper, silver and gold. The luminescent material that has been compensated with electric charge can be represented by the following general formula (B).

$(Sr_{a2}, Ba_{b2}, Ca_{c2}, Re_{v2}, Eu_{w2}, M_{v2})_2SiO_4$ (B)

wherein, Re is at least one selected from a group consisting of Pr and Dy; M is at least one selected from a group consisting of Li, Na, K, Rb and Cs; and a2, b2, c2, v2 and w2 satisfy following relationships:

$a2+b2+c2+2v2+w2=1$ (7);

$0 \leq a2/(1-2v2-w2) \leq 1$ (8);

$0 \leq b2/(1-2v2-w2) \leq 1$ (9);

$0 \leq c2/(1-2v2-w2) \leq 1$ (10);

$0 < v2 \leq 0.15$ (11);

$0 < w2 \leq 0.02$ (12).

In analyzing contents of each elements, the luminescent material synthesized is subjected at first to alkali fusion. The resultant material is then subjected to analysis by an ICP emission spectrometric method as an internal standard wherein SPS1200AR (SII Nanotechnology Co., Ltd.) can be employed for example. In this manner, the composition of luminescent material as represented by the aforementioned general formula (B) can be obtained.

As described above, in the alkaline earth orthosilicate compound, Sr, Ca and Ba exist therein in a state of complete solid solution. The range of values of a2, b2 and c2 related to the content of alkaline earth metal can be determined by the aforementioned condition, the content v2 of the second activator Re and the content w2 of the first activator. Namely, the aforementioned expressions of (8), (9) and (10) can be derived from the aforementioned conditions.

If the value of $a2/(1-2v2-w2)$ exceeds one, the resultant luminescent material would become one which falls out of the stoichiometric composition ratio of $(Sr_{a2}, Ba_{b2}, Ca_{c2}, Re_{v2}, Eu_{w2}, M_{v2})_2SiO_4$ luminescent material. As a result of this, the light-emitting efficiency may be degraded.

The w2 in the aforementioned general formula (B) corresponds to the w1 in the aforementioned general formula (A). Because of the same reason as in the case of w1, the range of w2 is confined to $0 < w2 \leq 0.02$. The element M to be employed for the charge compensation may be incorporated at the same quantity as the second activator Re. Therefore, since the content of v2 is confined to the range which does not cause the concentration quenching of the second activator as in the case of v1, the content (v2) of these Re and M is limited to 0.15 at most.

In the case of the luminescent material having a composition represented by the aforementioned general formula (A), the second emission peak consisting of the emission band originating from the first activator Eu may be varied within a peak wavelength region ranging from 500 to 600 nm by changing the kind and content of alkaline earth element and also by changing the concentration of Eu. Therefore, this luminescent material is very wide in applicability. In this case, since the location of wavelength of the first emission peak consisting of the emission band originating from the second activator Re is confined within a predetermined wavelength region and does not change in any substantial degree, the design of spectrum can be easily performed. Further, the luminescent material of this embodiment can be manufactured in the same manner as the ordinary oxide luminescent material and at low cost.

More specifically, the luminescent material of this embodiment can be manufactured according to the following method. As for the starting materials, it is possible to employ the oxide powders of constituent elements. Namely, the oxide powders of constituent elements are weighed to obtain a predetermined quantity and then mixed with each other in a ball mill, etc., together with a suitable quantity of ammonium chloride employed as a crystal-growing agent. Various compounds that can be turned into oxides through thermal decomposition may be employed in place of the oxide powders. For example, $Pr_6O_{11}$, etc., may be employed as a raw material for Pr, $Dy_2O_3$, etc., may be employed as a raw material for Dy, $Eu_2O_3$, etc., may be employed as a raw material for Eu, $SrCO_3$, etc., may be employed as a raw material for Sr, $BaCO_3$, etc., may be employed as a raw material for Ba, $CaCO_3$, etc., may be employed as a raw material for Ca, and $SiO_2$, etc., may be employed as a raw material for Si.

As the crystal-growing agent, it is possible to employ, other than aforementioned ammonium chloride, the chlorides, fluoride, bromide or iodide of ammonium, or the chlorides, fluoride, bromide or iodide of alkaline metals. It is also possible to employ the chlorides, fluoride, bromide or iodide of alkaline earth metals. In order to prevent any increase of hygroscopicity, the content of the crystal-growing agent should preferably be confined to the range of 0.01 to 1 wt % or so based on the entire quantity of raw material powder.

The mixed raw material obtained from the mixing of the aforementioned raw powders is then placed in a vessel such as a crucible and heat-treated to obtain a primary sintered product. This heat treatment can be performed in a reducing atmosphere such as $N_2/H_2$ or $Ar/H_2$. The purposes of this heat treatment are to synthesize a matrix of luminescent material and to promote the reduction of europium in the oxide employed as a raw material. The temperature of this heat treatment may be 1100-1500° C. and the time period of this heat treatment may be confined to the range of 3 to 7 hours. The primary sintered product thus obtained is then pulverized and placed again in a vessel. There is not any particular limitation with regard to the degree of this pulverization and hence the block of the primary sintered product may be pulverized using a mortar to increase the surface area thereof.

The primary sintered product thus pulverized is again placed in a furnace and the interior of furnace is evacuated and charged with an inert gas such as nitrogen gas or argon gas. In order to sufficiently remove the water and oxygen that have been adhered to the materials, the degree of vacuum on this occasion should desirably be set to not higher than 1000 Pa.

Then, the primary sintered product thus pulverized is subjected to heat treatment in a reducing atmosphere such as $N_2/H_2$ or $Ar/H_2$ to obtain a secondary sintered product. The temperature of this heat treatment may be 1100-1500° C. and the time period of this heat treatment may be confined to the range of 2 to 6 hours. During this sintering, the concentration of hydrogen gas in the atmosphere should be confined to 5% to less than 100%. If the concentration of hydrogen gas is less than 5%, the reduction of $Eu^{3+}$ to $Eu^{2+}$ may also become incomplete, thus deteriorating the luminescence intensity. Due to this repeated heat treatment (twice), the $Eu^{3+}$ in the luminescent material can be completely reduced and turned entirely into $Eu^{2+}$.

By doing the aforementioned method, a $(Sr_{0.76}, Ca_{0.19}, Dy_{0.05})_2SiO_4$ luminescent material wherein the concentration of Dy was 0.05 (v1=0.05) and the concentration of Eu was 0 (w1=0) and also a $(Sr_{0.76}, Ca_{0.19}, Eu_{0.05})_2SiO_4$ luminescent material wherein the concentration of Dy was 0 (v1=0) and the concentration of Eu was 0.05 (w1=0.05) were manufactured. Since either Dy as the second activator Re or Eu as the first activator was not included at all in these luminescent materials, each of these luminescent materials was the conventional luminescent material.

These luminescent materials were then excited with a near-ultraviolet LED having a peak wavelength of 392 nm to measure the emission spectrum. The results obtained are shown in FIG. 1. As shown in FIG. 1, it was possible to obtain a band emission originating from Eu2+ and having a peak wavelength of 586 nm from the (Sr0.76, Ca0.19, Eu0.05) 2SiO4 luminescent material. It was possible to obtain a light-emitting spectrum of narrowband originating from Dy3+ and having a peak wavelength of 573 nm from the (Sr0.76, Ca0.19, Dy0.05)2SiO4 luminescent material. It was possible to confirm also a peak wavelength originating from Dy3+ at a wavelength of 477 nm. However, the intensity of this peak was only 8% or so of that of the (Sr0.76, Ca0.19, Eu0.05) 2SiO4 luminescent material. It will be recognized from these results that the luminescence intensity originating from Dy3+ of the (Sr0.76, Ca0.19, Dy0.05)2SiO4 luminescent material is too weak to make it applicable to practical use.

Generally, in the case of the luminescent material activated with dysprosium, the excitation light is absorbed by the 5d-4f transition of $Dy^{3+}$ and the emission of light is caused to generate by the 4f-4f transition. In the case where an exciting light having a peak intensity at a long wavelength of 254 nm or more is employed, since an absorption band is not existed in $Dy^{3+}$, the exciting light can be scarcely absorbed and hence light can be scarcely generated.

By following the aforementioned manufacturing method, a $(Sr_{0.885}, Ba_{0.06}, Dy_{0.05}, Eu_{0.005})_2SiO_4$ luminescent material and also a $(Sr_{0.756}, Ca_{0.189}, Dy_{0.05}, Eu_{0.005})_2SiO_4$ luminescent material were manufactured. The luminescent materials thus obtained were excited by a near-ultraviolet LED having a peak wavelength of 392 nm to measure the emission spectrum thereof. The results thus obtained are shown in FIGS. 2 and 3, respectively.

As shown in FIG. 2, it was possible to obtain an emission originating from $Dy^{3+}$ and having a peak wavelength of 565 nm as well as an emission originating from $Eu^{2+}$ from the $(Sr_{0.885}, Ba_{0.06}, Dy_{0.05}, Eu_{0.005})_2SiO_4$ luminescent material. Further, as shown in FIG. 3, it was possible to obtain an emission originating from $Dy^{3+}$ and having a peak wavelength of 575 nm as well as an emission originating from $Eu^{2+}$ from the $(Sr_{0.756}, Ba_{0.189}, Dy_{0.05} Eu_{0.005})_2SiO_4$ luminescent material. In the cases of the $(Sr_{0.885}, Ba_{0.06}, Dy_{0.05} Eu_{0.005})_2SiO_4$ luminescent material and the $(Sr_{0.756}, Ba_{0.189}, Dy_{0.05}, Eu_{0.005})_2SiO_4$ luminescent material, the luminescent materials having the same composition and activated only with Eu were manufactured to determine the peak wavelength of the emission originating from $Eu^{2+}$.

A $(Sr_{0.716}, Ca_{0.179}, Dy_{0.10}, Eu_{0.005})_2SiO_4$ luminescent material and also a $(Sr_{0.759}, Ca_{0.190}, Dy_{0.05}, Eu_{0.001})_2SiO_4$ luminescent material were manufactured according to the aforementioned method. The luminescent materials thus obtained were excited by a near-ultraviolet LED having a peak wavelength of 392 nm to measure the emission spectrum thereof. The results thus obtained are shown in FIGS. 4 and 5, respectively.

Figure 4:
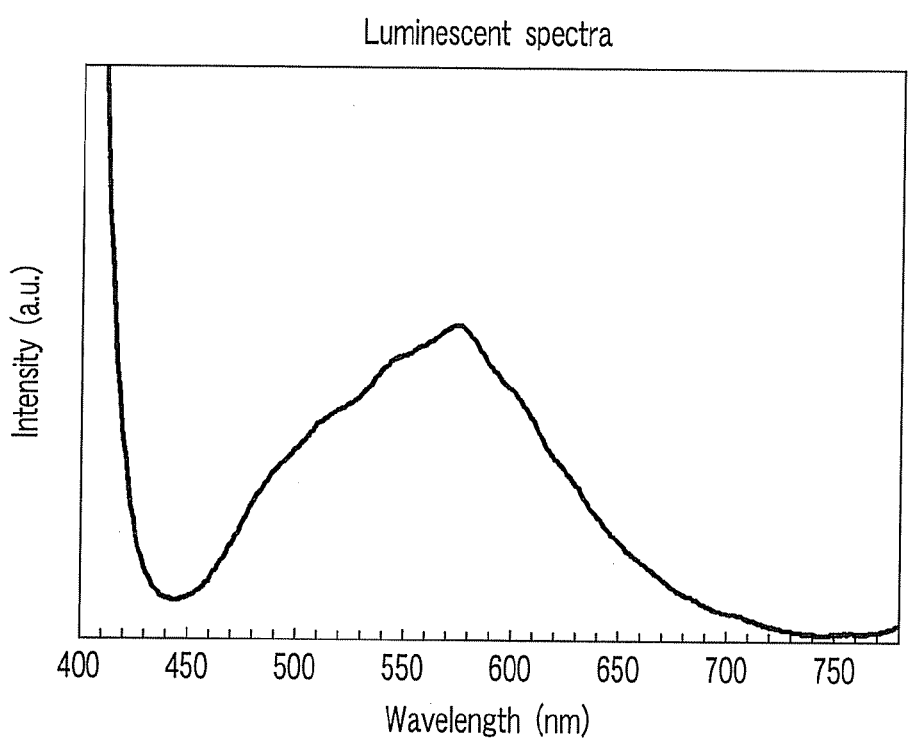
FIG. 4 is a light-emitting spectrum of the luminescent material according to another embodiment.
Figure 5:
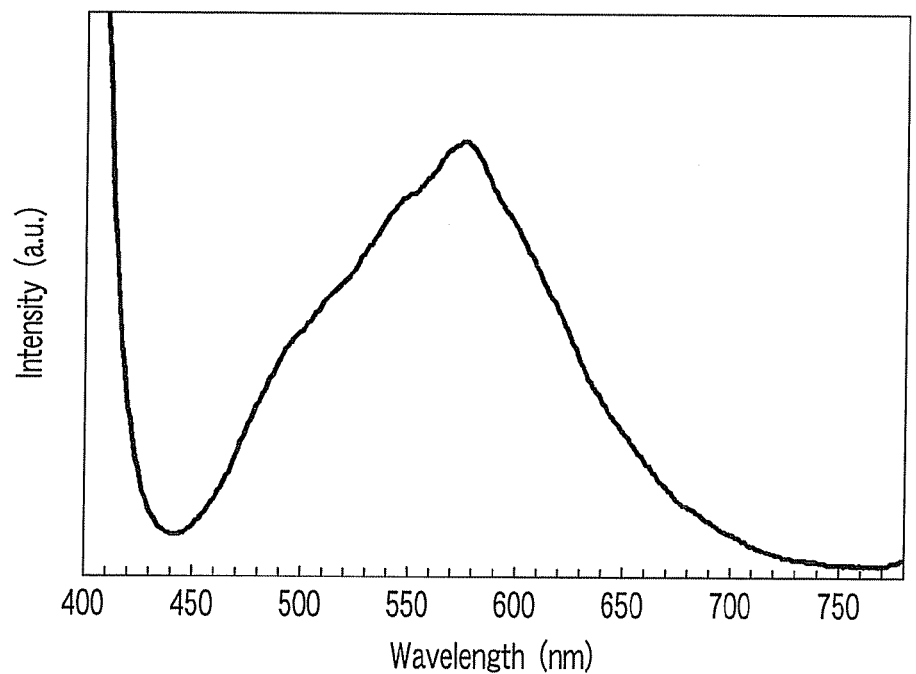
FIG. 5 is a light-emitting spectrum of the luminescent material according to another embodiment.

As shown in FIG. 4, it was possible to obtain an emission originating from $Dy^{3+}$ and having a peak wavelength of 574 nm as well as an emission originating from $Eu^{2+}$ from the $(Sr_{0.76} Ca_{0.179}, Dy_{0.10}, Eu_{0.005})_2SiO_4$ luminescent material. Further, as shown in FIG. 5, it was possible to obtain an emission originating from $Dy^{3+}$ and having a peak wavelength of 574 nm as well as an emission originating from $Eu^{2+}$ from the $(Sr_{0.759}, Ba_{0.190}, Dy_{0.05}, Eu_{0.001})_2SiO_4$ luminescent material. In the same manner as in the cases of FIGS. 2 and 3, the luminescent materials having the same composition and activated only with Eu were manufactured to determine the peak wavelength of the emission originating from $Eu^{2+}$.

Further, a $(Sr_{0.716}, Ca_{0.179}, Dy_{0.05}, Eu_{0.005}, Cs_{0.05})_2SiO_4$ luminescent material and also a $(Sr_{0.716}, Ca_{0.179}, Dy_{0.05}, Eu_{0.005}, Li_{0.05})_2SiO_4$ luminescent material were manufactured according to the aforementioned method. The luminescent materials thus obtained were excited by a near-ultraviolet LED having a peak wavelength of 392 nm to measure the emission spectrum thereof. The results thus obtained are shown in FIGS. 6 and 7, respectively.

Figure 6:
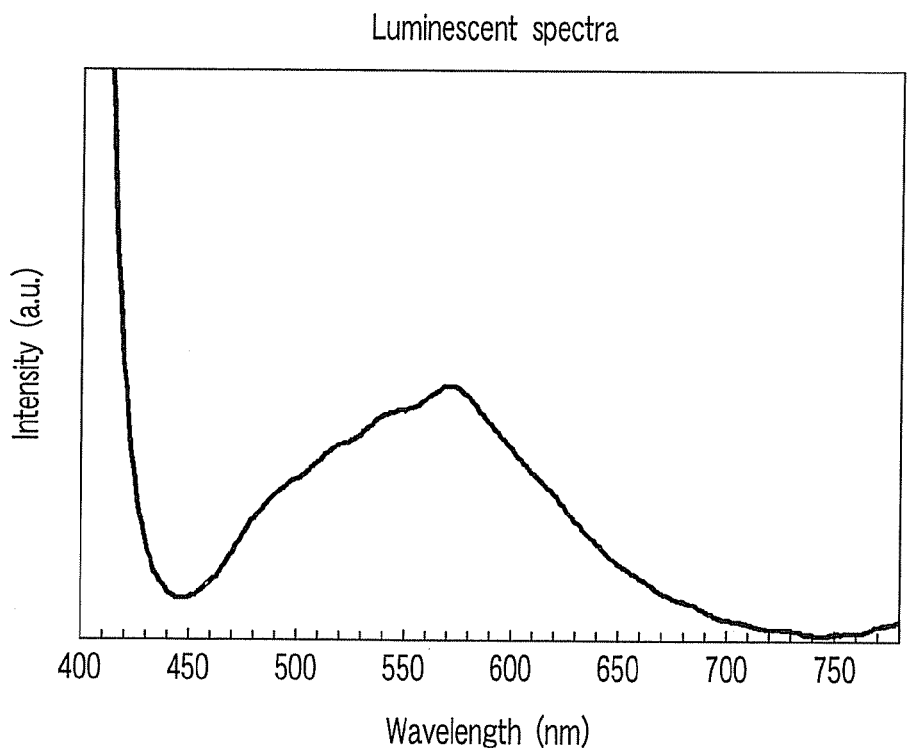
FIG. 6 is a light-emitting spectrum of the luminescent material according to another embodiment.
Figure 7:
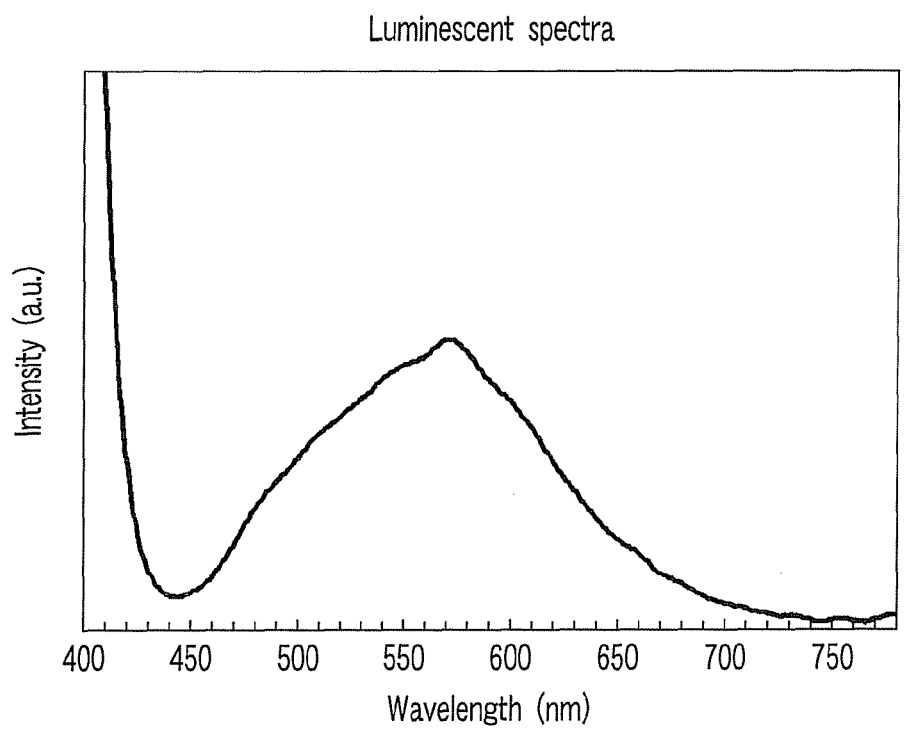
FIG. 7 is a light-emitting spectrum of the luminescent material according to another embodiment.

As shown in FIG. 6, it was possible to obtain an emission originating from $Dy^{3+}$ and having a peak wavelength of 569 nm as well as an emission originating from $Eu^{2+}$ from the $(Sr_{0.716}, Ca_{0.179}, Dy_{0.05}, Eu_{0.005}, Cs_{0.05})_2SiO_4$ luminescent material. Further, as shown in FIG. 7, it was possible to obtain an emission originating from $Dy^{3+}$ and having a peak wavelength of 570 nm as well as an emission originating from $Eu^{2+}$ from the $(Sr_{0.716}, Ca_{0.179}, Dy_{0.05}, Eu_{0.005}, Li_{0.05})_2SiO_4$ luminescent material. In the same manner as in the cases of FIGS. 2 through 5, the luminescent materials having the same composition and activated only with Eu were manufactured to determine the peak wavelength of the emission originating from $Eu^{2+}$ in the cases of FIGS. 6 and 7.

Figure 8:
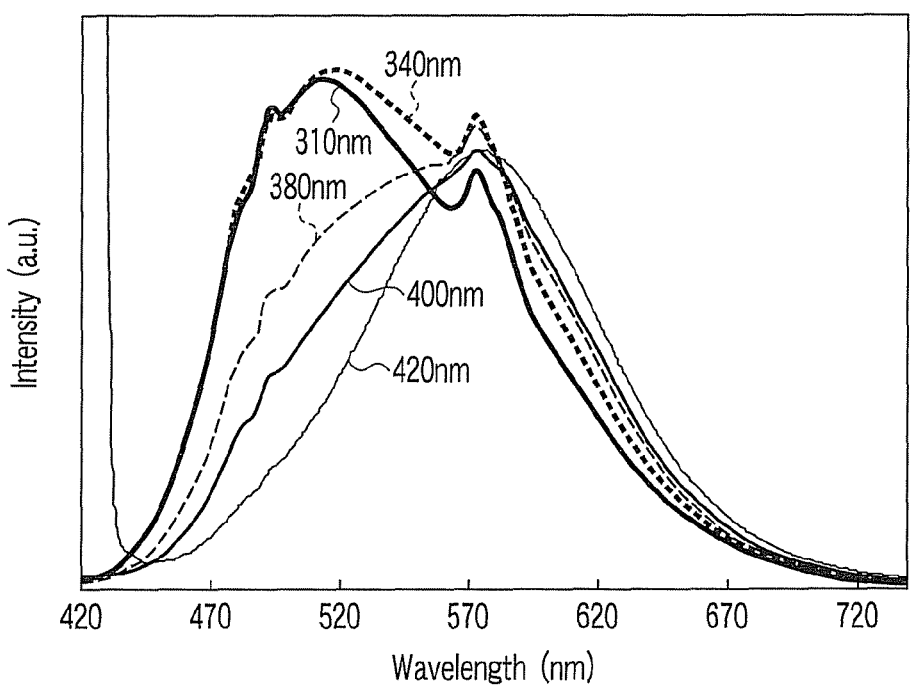
FIG. 8 is a light-emitting spectrum of the luminescent material according to another embodiment.
Figure 9:
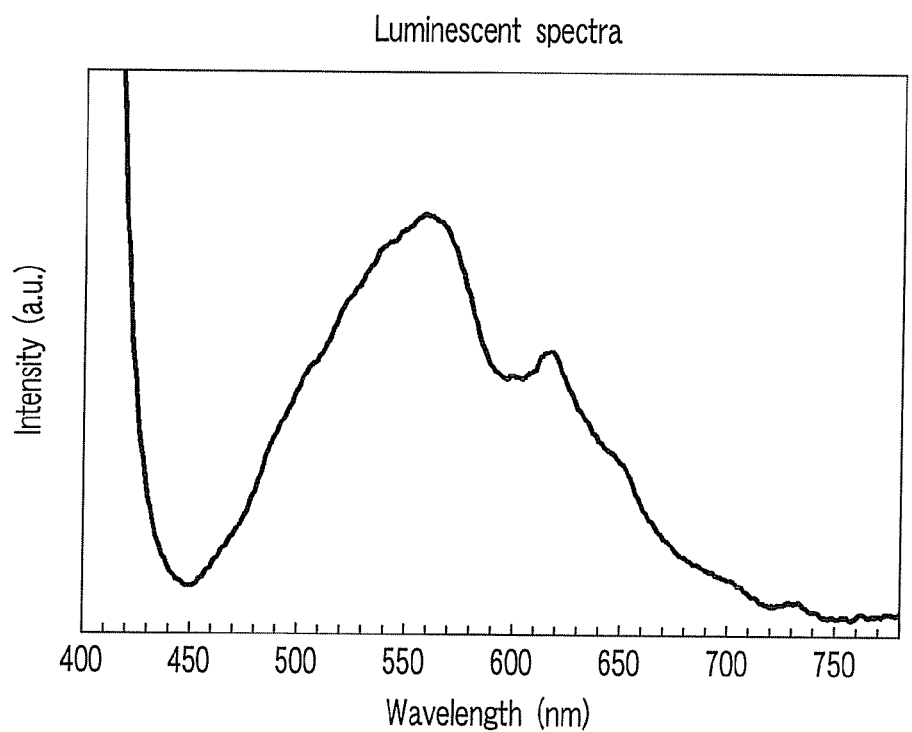
FIG. 9 is a light-emitting spectrum of the luminescent material according to another embodiment.
Figure 10:
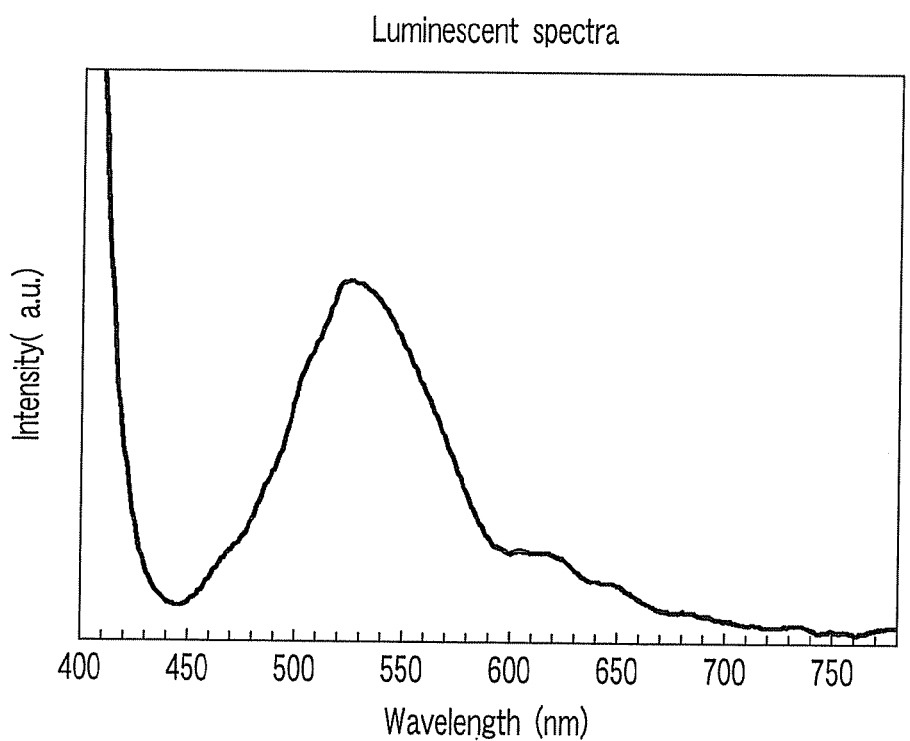
FIG. 10 is a light-emitting spectrum of the luminescent material according to another embodiment.
Figure 11:
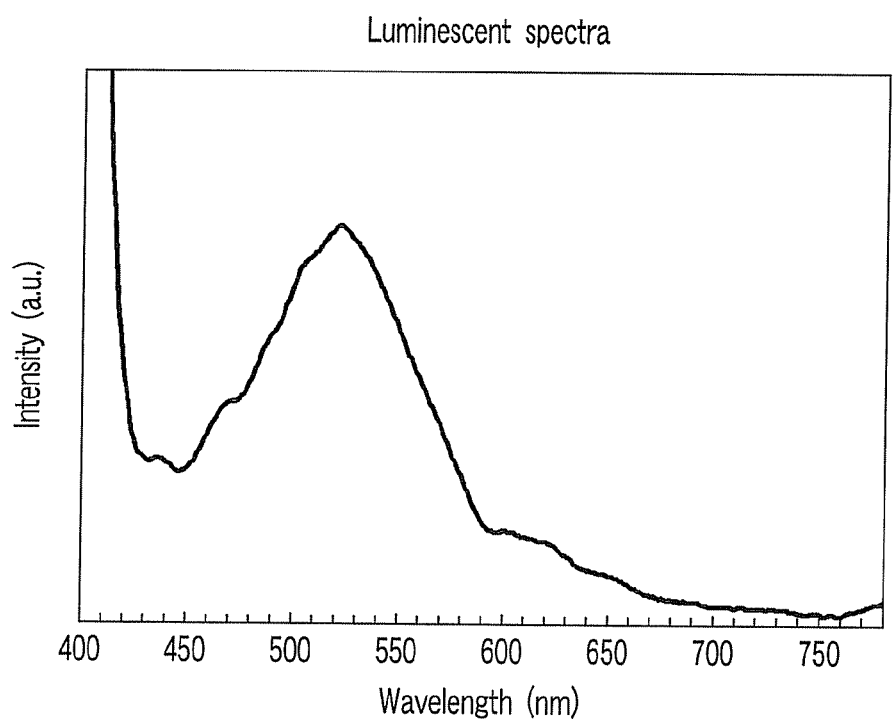
FIG. 11 is a light-emitting spectrum of the luminescent material according to another embodiment.
Figure 12:
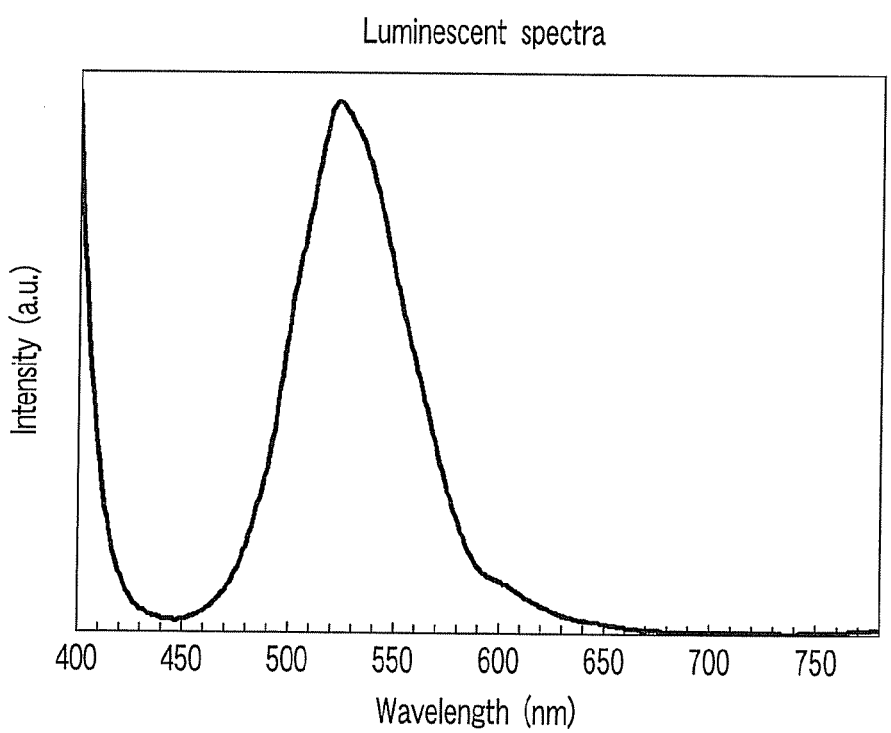
FIG. 12 is a light-emitting spectrum of the luminescent material according to another embodiment.
Figure 13:
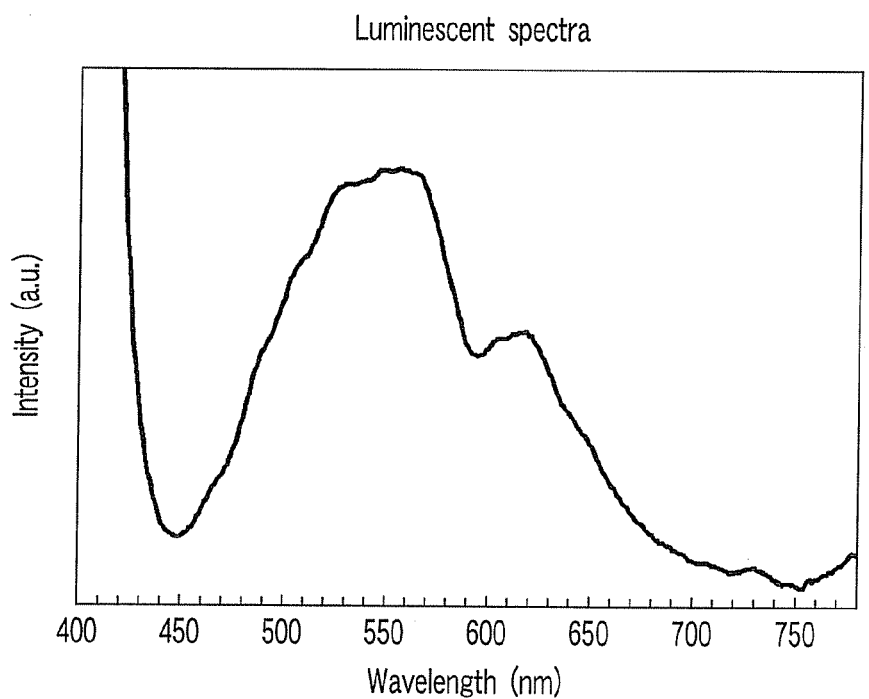
FIG. 13 is a light-emitting spectrum of the luminescent material according to another embodiment.
Figure 14:
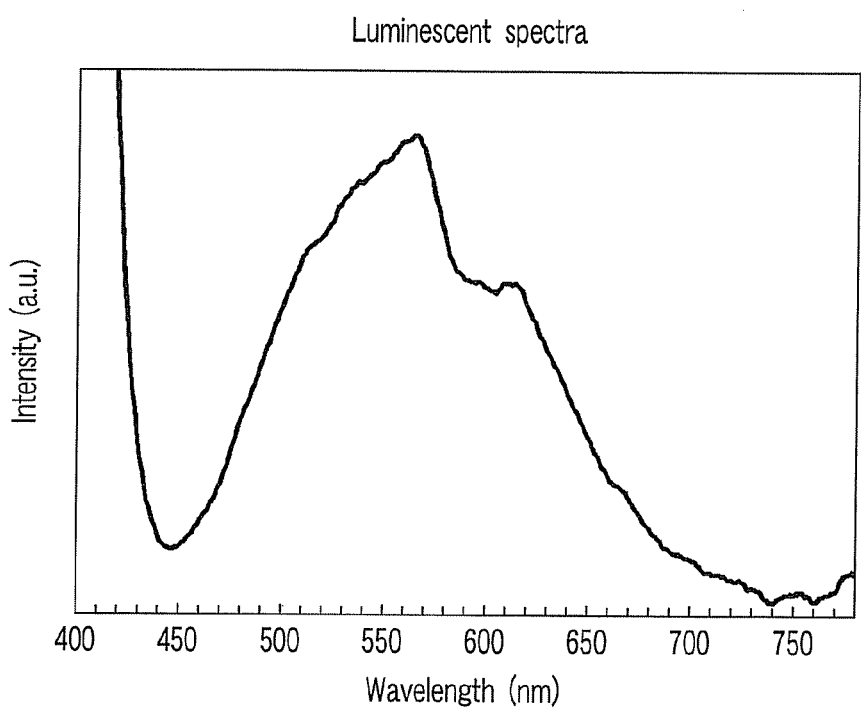
FIG. 14 is a light-emitting spectrum of the luminescent material according to another embodiment.

Next, the $(Sr_{0.756}, Ca_{0.189}, Dy_{0.05}, Eu_{0.005})_2SiO_4$ luminescent material was excited by changing the wavelength of the exciting light, thus measuring the emission spectrum. The kinds of the wavelength of the exciting light were regulated to five kinds, i.e., 310, 340, 380, 400 and 420 nm. The emission spectra obtained from these exciting lights are shown in FIG. 8. It will be found from these spectra that the emission peaks of 494 and 573 nm originating from $Dy^{3+}$ were caused to decrease in proportion to an increase in wavelength of exciting light. However, it will be recognized from the comparison thereof with the emission spectrum of FIG. 1 that, even with the exciting light of 420 nm, an emission peak originating from $Dy^{3+}$ was permitted to exist.

Likewise, a $(Sr_{0.756}, Ca_{0.189}, Pr_{0.05}, Eu_{0.005})_2SiO_4$ luminescent material, a $(Sr_{0.189}, Ca_{0.756}, Pr_{0.05}, Eu_{0.005})_2SiO_4$ luminescent material, a $(Ba_{0.189}, Ca_{0.756}, Pr_{0.05}, Eu_{0.005})_2SiO_4$ luminescent material, a $(Ba_{0.756}, Ca_{0.189}, Pr_{0.05}, Eu_{0.005})_2SiO_4$ luminescent material, a $(Sr_{0.758}, Ca_{0.190}, Pr_{0.05}, Eu_{0.005})_2SiO_4$ luminescent material, and a $(Sr_{0.716}, Ca_{0.179}, Dy_{0.05}, Pr_{0.05}, Eu_{0.005})_2SiO_4$ luminescent material were manufactured. The luminescent materials thus obtained were excited by a near-ultraviolet LED having a peak wavelength of 392 nm to measure the emission spectrum thereof. The results thus obtained are shown in FIGS. 9 through 14, respectively. In any of these luminescent materials, an emission peak originating from $Pr^{3+}$ was found existed in the vicinity of 520 and of 565 nm.

Next, the $(Sr_{0.756}, Ca_{0.189}, Pr_{0.05}, Eu_{0.005})_2SiO_4$ luminescent material was excited by changing the wavelength of the exciting light, thus measuring the emission spectrum. The kinds of the wavelength of the exciting light were regulated to five kinds, i.e., 320, 340, 360, 380 and 400 nm. The emission spectra obtained from each of these exciting lights are shown in FIG. 15. It will be found from these spectra that the emission peaks of 494 and 573 nm originating from $Pr^{3+}$ were caused to decrease in proportion to an increase in wavelength of exciting light. However, it will be recognized from the comparison thereof with the emission spectrum of FIG. 1 that, even with the exciting light of 420 nm, an emission peak originating from $Pr^{3+}$ was permitted to exist.

As described above, the luminescent material according to this embodiment was enabled to exhibit emission peaks in two specific wavelength regions owing to the effects of the first activator and the second activator as the luminescent material was excited by the light having a peak wavelength falling within the range of 310 to 420 nm. More specifically, an emission peak of the ionized first activator ($Eu^{2+}$) was indicated in a wavelength region of 500 to 600 nm. In the case where the second activator was constituted by Dy, the emission peak was permitted to appear in a wavelength region of 565 to 580 nm due to the existence of $Dy^{3+}$. In the case where the second activator was constituted by Pr, the emission peak was permitted to appear in a wavelength region of 500 to 520 nm due to the existence of $Pr^{3+}$.

Namely, in the case of the luminescent material according to this embodiment, the emission of light from the luminescent material which has been activated with the second activator Re is caused to generate due to the 4f-4f transition after the absorption of light by the 5d-4f transition of the ionized second activator $Re^{3+}$. Since the energy of the 5d-4f transition of $Re^{3+}$ is relatively large, there is no absorption band in $Re^{3+}$ when an exciting light ranging from ultraviolet region to near-ultraviolet region or a long wavelength region of 300 nm or more is employed and hence the exciting light can be scarcely absorbed and the emission of light can be scarcely generated.

In the case of the luminescent material having a composition represented by the general formula (A) which is activated with the second activator Re and the first activator Eu, $Eu^{2+}$ is enabled to act as a sensitizing agent. Or else, it may be assumed that as the $(Sr, Ba, Ca, Eu)_2SiO_4$ luminescent material is activated with the second activator Re, the f-d energy level of $Re^{3+}$ is caused to decrease below the ordinary level, thus making it possible to absorb the light of near-ultraviolet region.

Namely, the exciting light is absorbed by $Eu^{2+}$ at first and then the energy thus absorbed is permitted to move to the ionized second activator Re, thereby making it possible to derive the emission of $Re^{3+}$. Alternatively, it may be assumed that as the $(Sr, Ba, Ca, Eu)_2SiO_4$ luminescent material is activated with the second activator Re, the exciting light is directly absorbed by Re, thereby making it possible to derive the emission of $Re^{3+}$. When the excitation spectrum of emission recognized in a wavelength region of 565 to 580 nm and originated from the $Re^{3+}$ of the luminescent material having a composition represented by the aforementioned general formula (A) was measured, the absorption of light up to a wavelength close to 500 nm was recognized. This excitation spectrum can be obtained through the measurement of luminescent material powder by diffusion scattering method and by, for example, a Fluoro-spectrophotometer "F-3000" (Hitachi Seisakusho Co., Ltd.).

FIG. 16 shows an excitation spectrum which was obtained through the observation of the emission of 575 nm in wavelength and derived from the $(Sr_{0.756}, Ca_{0.189}, Dy_{0.05} Eu_{0.005})_2SiO_4$ luminescent material. It will be recognized from FIG. 16 that the $(Sr_{0.756}, Ca_{0.189}, Dy_{0.05} Eu_{0.005})_2SiO_4$ luminescent material can be excited within the wavelength range of 300 to 540 nm. As a matter of fact however, when this luminescent material is excited with a light having an exciting wavelength exceeding 420 nm, only a broadband light-emission originating from $Eu^{2+}$ is obtained, thus failing to obtain a narrowband light-emission originating from $Dy^{3+}$. It will be recognized from these results that the luminescent material of this embodiment can be excited with light having an exciting wavelength of up to 420 nm.

Further, the $(Sr_{0.756}, Ca_{0.189}, Dy_{0.05}, Eu_{0.005})_2SiO_4$ luminescent material was subjected to fluorescence microscopic observation. Namely, this fluorescence microscopic observation was performed by observing the emission from a sample of luminescent material by an excitation light having a wavelength of 365 nm with the employment of NIKON ECLIPSE80i for example. It was possible to confirm from the results of this fluorescence microscopic observation that this synthesized $(Sr_{0.756}, Ca_{0.189}, Dy_{0.05}, Eu_{0.005})_2SiO_4$ luminescent material was constituted by particles having a particle diameter ranging from 10 μm to 30 μm or so and being capable of emitting uniform light as it was excited with an exciting light having a wavelength of 365-435 nm. Further, the color of emitting light was yellow.

FIG. 17 shows the results of microscopic observation of the $(Sr_{0.756}, Ca_{0.189}, Dy_{0.05}, Eu_{0.005})_2SiO_4$ luminescent material excited with an exciting light having a wavelength of 365 nm.

If required for the purpose of preventing moisture, a surface layer material may be coated on the surface of luminescent particles manufactured according to this embodiment, the surface layer material being formed of at least one selected from the group consisting of silicone resin, epoxy resin, fluororesin, tetraethoxy silane (TEOS), silica, zinc silicate, aluminum silicate, calcium polyphosphate, silicone oil and silicone grease. Zinc silicate and aluminum silicate may be represented, for example, by $ZnO \cdot cSiO_2$ ($1 \leq c \leq 4$) and $Al_2O_3 \cdot dSiO_2$ ($1 \leq d \leq 10$), respectively.

The surface of the luminescent particles may not be completely covered with the surface layer material, so that part of the surface of the luminescent particles may be exposed. As long as the surface layer material made of the aforementioned materials is existed on the surface of the luminescent particles, it is possible to derive the effects thereof. This surface layer material can be applied to the surface of the luminescent particles by a dispersion containing the surface layer material or of a solution of the surface layer material. Specifically, the luminescent particles are immersed in the dispersion or the solution for a predetermined period of time and then dried by heating, etc., thus depositing the surface layer material on the surface of luminescent particles. In order to secure the effects of the surface layer material without deteriorating the inherent functions of the luminescent particles, the quantity of the surface layer material should preferably be confined to about 0.1-5% by volume based on the luminescent particles.

As described above, when a luminescent material comprising the first activator Eu and the second activator Re is activated, especially when a alkaline earth orthosilicate luminescent material comprising the first activator Eu and the second activator Re is activated by an exciting light having a main light emission peak falling within the range of 310 to 420 nm, emission peaks are enabled to appear in two specific wavelength regions. A first emission peak can be attributed to the second activator Re. In the case where the second activator is constituted by Dy, the emission peak appears in a wavelength region of 565 to 580 nm. In the case where the second activator is constituted by Pr, the emission peak appears in a wavelength region of 500 to 520 nm. A second emission peak can be attributed to the first activator Eu and is permitted to appear in a wavelength region of 500 to 600 nm.

Further, when the luminescent material of this embodiment is used in combination with a light-emitting element having a main light emission peak falling within the range of 310 to 420 nm, it is possible to obtain a light-emitting device excellent in efficiency and in color rendering. As the light-emitting element, it is possible to employ either an LED chip or a laser diode. According to the light-emitting device of this embodiment, it is possible to secure an average color rendering index Ra of 60 or more. This can be attributed to the narrowband light-emission of the second activator. More specifically, in the case where Dy is employed, it can be attributed to the narrowband light-emission in the vicinity of 490 nm. In the case where Pr is employed, it can be attributed to the narrowband light-emission in the vicinity of 520 nm. The emission of light in the vicinity of these wavelengths has an effect of burying a gap of emission between the emission of blue region and the emission of green or yellow region, which have been conventionally employed for creating white color. Due to this effect, it is assumed as being made possible to enhance the value of Ra.

The luminescent material according to this embodiment is capable of emitting a range of colors spanning from green to yellow. Therefore, it is possible to obtain a white light-emitting device as this luminescent material is employed in combination with a blue luminescent material and a red luminescent material. For example, in a case where a light source of blue region is employed, the luminescent material according to this embodiment can be employed in combination with a red luminescent material, thereby making it possible to provide a white light-emitting device. Further, in a case where a light source of near-ultraviolet region is employed, the luminescent material according to this embodiment can be employed in combination with a blue luminescent material and a red luminescent material, thereby making it possible to provide a white light-emitting device.

The blue luminescent material can be defined as being a luminescent material having a main light emission peak in a wavelength region ranging from bluish purple to blue color and having a wavelength of 430 to 510 nm. As examples of the blue luminescent material, it is possible to employ, for example, halophosphate luminescent materials such as (Sr, Ca, Ba, Mg)$_5$(PO$_4$)$_3$(Cl, Br):Eu, (Sr, Ca, Ba, Mg)$_5$(PO$_4$)$_3$Cl: Eu, etc.; phosphate luminescent materials such as 2SrO·0.84P$_2$O$_5$·0.16B$_2$O$_3$, etc.; and alkaline earth metal aluminate luminescent materials such as BaMgAl$_{10}$O$_{17}$:Eu, BaMg$_2$Al$_{16}$O$_{27}$:Eu, BaMgAl$_{10}$O$_{17}$:Eu,Mn, etc. Incidentally, by the term "main light emission peak" regarding the luminescent material and the light-emitting element, it is intended to mean a wavelength at which the peak intensity of the emission spectrum as reported so far in publications such as patent publication becomes the largest. The fluctuation of emission peak of around 10 nm due to the addition of a small amount of element or due to slight changes in composition on the occasion of manufacturing the luminescent material may be regarded as being the main light emission peak that has been reported so far.

The red luminescent material can be defined as being a luminescent material having a main light emission peak in a wavelength region ranging from orange to red color and having a wavelength of 580 to 680 nm. As examples of the red luminescent material, it is possible to employ, for example, silicate luminescent materials such as (Sr, Ca, Ba)$_2$SiO$_4$:Eu, etc.; acid fluoride luminescent materials such as 3.5MgO·0.5MgF·GeO$_2$:Mn, etc.; oxide luminescent materials such as YVO$_4$:Eu, etc.; acid sulfide luminescent materials such as (La, Gd, Y)$_2$O$_2$S:Eu, etc.; sulfide luminescent materials such as (Ca, Sr, Ba)S:Eu, etc.; and nitride luminescent materials such as (Sr, Ba, Ca)$_2$Si$_5$N$_8$:Eu, (Sr, Ca)AlSiN$_3$:Eu, etc.

Figure 18:
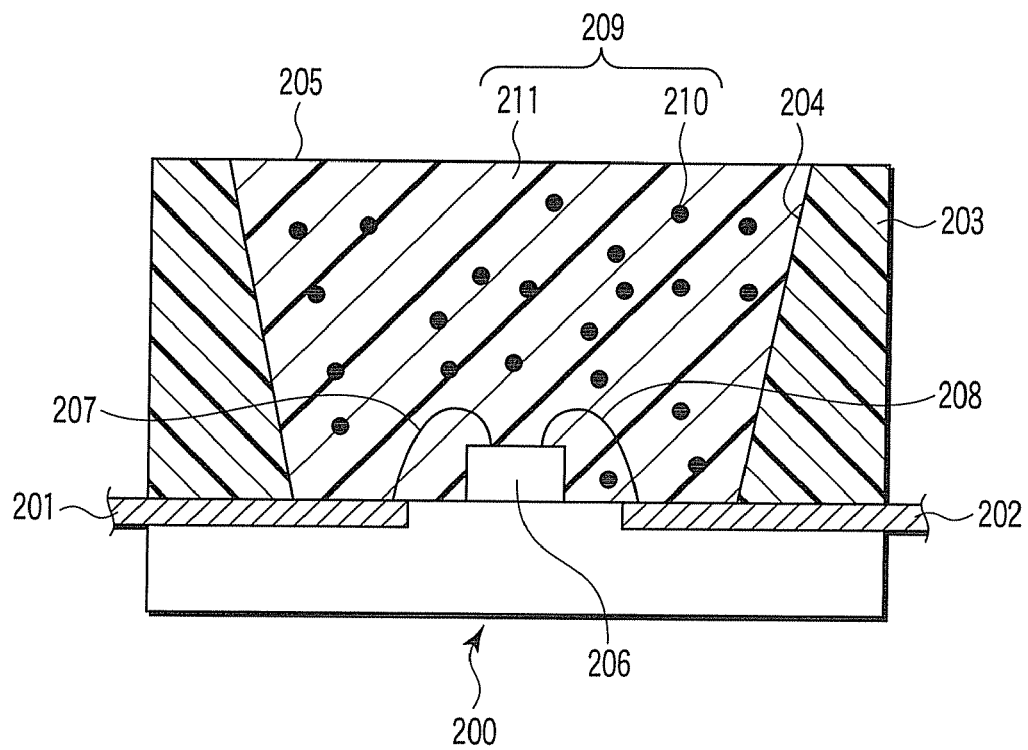
FIG. 18 is a cross-sectional view of a light-emitting device according to one embodiment.

As shown in cross-section view shown in FIG. 18, the light-emitting device of the embodiment has a lead 201 and a lead 202 in which a resin stem 200 is composed by molding a lead frame and a resin part 203 integrally molded with this. The resin part 203 has a recess 205 in which the upper opening part is wider than that of the bottom face part, and a reflecting surface 204 is installed at the side of this recess.

A light-emitting chip 206 is mounted on the center of the approximately circular bottom face of the recess 205 by Ag paste or the like. As the light-emitting chip 206, that which performs ultraviolet light emission or that which performs light emission in visible light region can be used. For instance, the semiconductor light-emitting diode or the like such as GaAs based one and GaN based one can be used. An electrode (not shown) of the light-emitting chip 206 is connected respectively to the lead 201 and the lead 202 by bonding wires 207 and 208 composed of Au or the like. Furthermore, the arrangement of the lead 201 and 202 can be changed depending upon circumstances.

A luminescent layer 209 is provided in the recess 205 of the resin part 203. This luminescent layer 209 can be formed by dispersing the luminescent material 210 of the embodiment at the content of 5 to 50 wt % in a resin layer 211 composed of for instance a silicone resin. The luminescent material can be adhered by various binders such as the resin which is an organic material or glass which is an inorganic material.

As the binder of the organic material, apart from the above described silicone resin, a transparent resin superior in light resistance such as epoxy resin and acrylic resin is suitable. As the binder of the inorganic material, a low-melting point glass or the like using an alkaline earth borate or the like, ultrafine particle silica and alumina or the like in order to adhere the luminescent material of a large particle diameter, and an alkaline earth phosphate or the like obtained by a precipitation method are suitable. These binders may be used by one or in combination with two or more.

Furthermore, as the luminescent material used for the luminescent layer, a coating treatment can be applied on the surface if necessary. By this surface coating, the luminescent material is prevented from being degraded because of external factors such as heat, humidity, and ultraviolet rays. Furthermore, dispersibility of the luminescent material is enabled to be adjusted, and a design of the luminescent layer can be carried out easily.

As the light-emitting chip 206, it is also possible to use a flip chip type having an n-type electrode and a p-type electrode on the same surface. In this case, problems attributed to the wire such as disconnection and detachment of the wire and light absorption by the wire are solved, and the semiconductor light-emitting device of high reliability and high brightness is obtained. Furthermore, by using an n-type substrate for the light-emitting chip 206, the following constitution is also made possible. Concretely, the n-type electrode is formed on the rear face of the n-type substrate, the p-type electrode is formed on the upper surface of the semiconductor layer formed on the substrate, and the n-type electrode or the p-type electrode is bonded on the lead. The p-type electrode or the n-type electrode can be connected to the other lead by the wire. The size of the light-emitting chip 206, and the dimension and the shape of the recess 205 can be changed depending upon circumstances.

Figure 19:
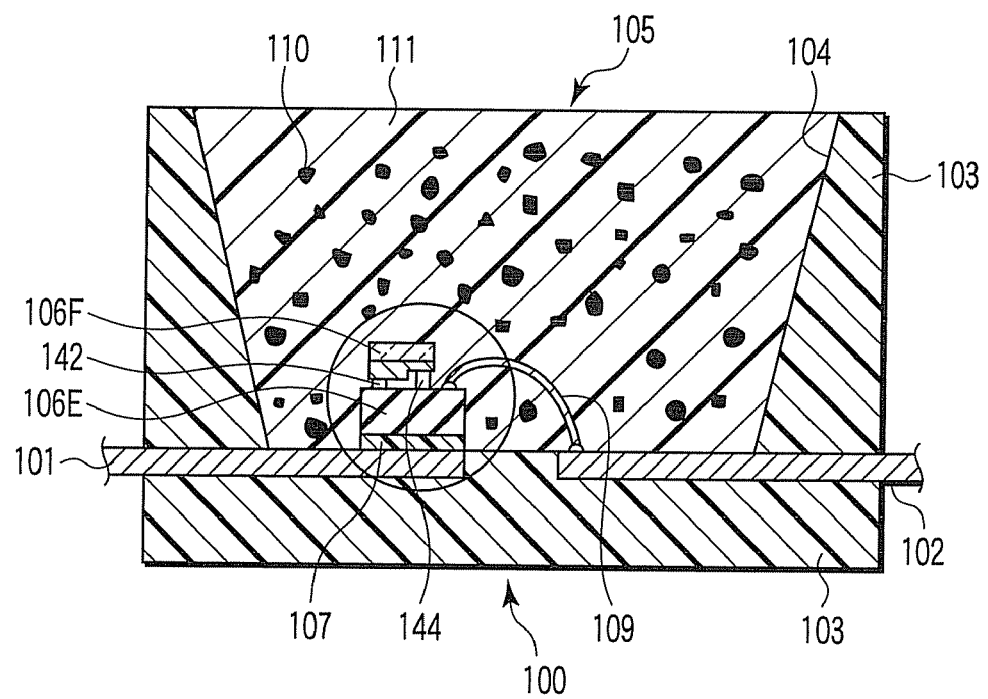
FIG. 19 is a cross-sectional view of a light-emitting device according to another embodiment.

As shown in a cross-section view of FIG. 19, the light-emitting device of the embodiment has a resin stem 100, the semiconductor light-emitting element 106F bonded on it, and a sealing body 111 to cover this semiconductor light-emitting element 106F. The sealing resin stem 100 has the leads 101 and 102 formed by the lead frame, and the resin part 103 molded integrally with these. The leads 101 and 102 are arranged with one ends of respective leads adjacent and opposed. The other ends of the leads 101 and 102 are extended and exist in mutually opposite directions and led out to the outside from the resin part 103.

The recess 105 is installed at the resin part 103 and a protective zener diode 106E is bonded on the bottom of the recess by an adhesive 107. The semiconductor light-emitting element 106F is located on a protective zener diode 106E. That is, the diode 106E is bonded on the lead 101. The wire 109 is connected from the diode 106E to the lead 102.

The semiconductor light-emitting element 106F is surrounded by the inner side of the resin part 103, and this inner side is inclined toward a light extraction direction and acts as the reflecting face 104 to reflect light. The sealing body 111 filled in the recess 105 contains the luminescent material 110. The semiconductor light-emitting element 106F is arranged on the protective zener diode 106E. The luminescent material according to the embodiment is used as the luminescent material 110.

Figure 20:
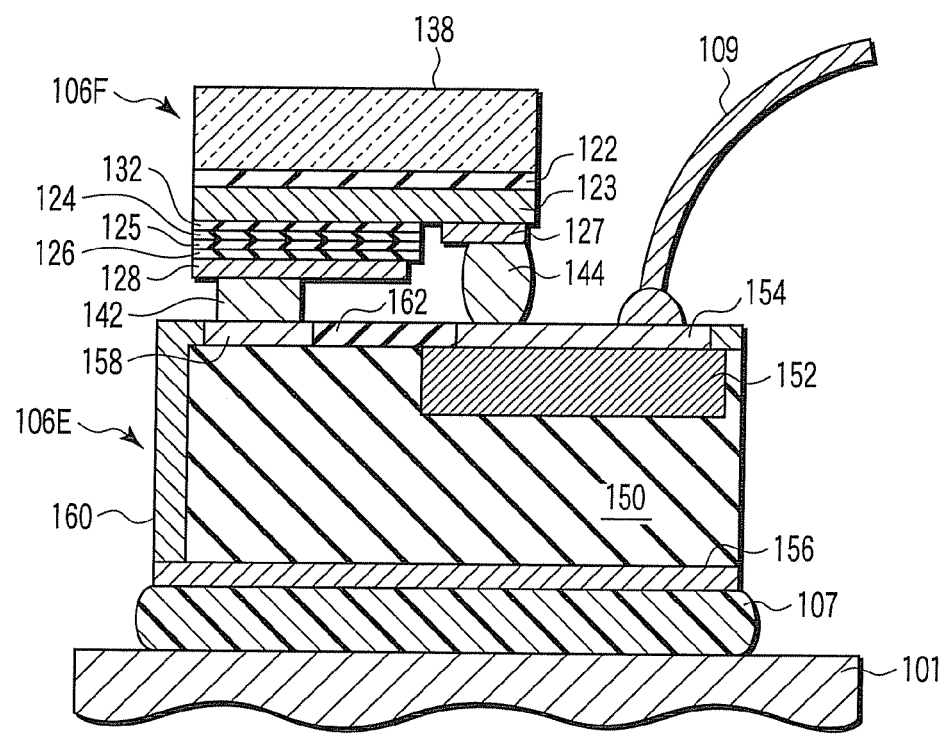
FIG. 20 is an enlarged cross-sectional view of the light-emitting device.

As shown in enlarged view of FIG. 20, the protective diode 106E has a planar structure in which a p-type region 152 is formed on the surface of an n-type silicon substrate 150. A p-side electrode 154 is formed in the p-type region 152, and an n-side electrode 156 is formed on the rear face of the substrate 150. Opposed to this n-side electrode 156, the n-side electrode 158 is also formed on the surface of the diode 106E. Such two n-side electrodes 156 and 158 are connected by a wiring layer 160 formed at the side of the diode 106E. Furthermore, a highly reflecting film 162 is formed on the surface of the diode 106E at which the p-side electrode 154 and the n side electrode 158 are installed. The highly reflecting film 162 has a high reflectivity to light emitted from the light-emitting element 106F.

In the semiconductor light-emitting element 106F, a buffer layer 122, an n-type contact layer 123, an n-type clad layer 132, an active layer 124, a p-type clad layer 125, and a p-type contact layer 126 are successively formed on a transparent substrate 138. Furthermore, the n-side electrode 127 is formed on the n-type contact layer 123, and the p-side electrode 128 is formed on the p-type contact layer 126. The light emitted from the active layer 124 is extracted by transmitting the transparent substrate 138.

The light-emitting element 106F having such structure is flip chip bonded on the diode 106E via a bump. Concretely, by the bump 142, the p-side electrode 128 of the light-emitting element 106F is electrically connected to the n-side electrode 158 of the diode 106E. Furthermore, by the bump 144, the n-side electrode 127 of the light-emitting element 106F is electrically connected to the p-side electrode 154 of the diode 106E. On the p-side electrode 154 of the diode 106E, a wire 109 is bonded, and this wire 109 is connected to the lead 102.

Figure 21:
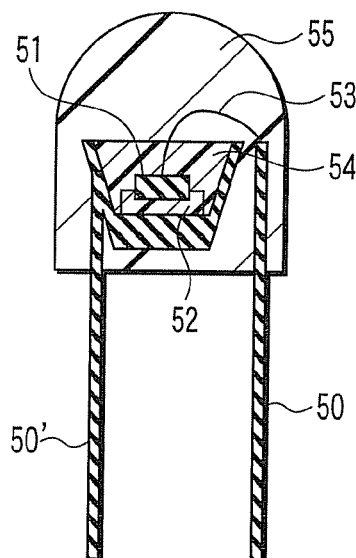
FIG. 21 is a cross-sectional view of a light-emitting device according to another embodiment.

As shown in FIG. 21, in a lead-type light-emitting device, the semiconductor light-emitting element 51 is arranged on the lead 50' via a bond material 52, and covered by a pre-dip material 54. The lead 50 is connected to the semiconductor light-emitting element 51 by a wire 53, and sealed by a casting material 55. In the pre-dip material 54, the luminescent material of the embodiment is contained.

As described above, the light-emitting device of the embodiment, for instance, the white LED has light of the narrowband spectrum. Because of this, this device is most suitable not only as an ordinary illumination application such as a fluorescent lamp but also as a light-emitting device used by combining a filter such as a color filter and the light source, for instance, the light source or the like for a backlight for a liquid crystal. Since a conventional white LED has the light of the broadband spectrum, in the case the white LED and the color filter are combined, it had a shortcoming that most of the light emitted from the white LED as the light source was absorbed by the filter.

However, since the white LED of the embodiment has the light of the narrowband spectrum when combined with the filter, a specific wavelength can be utilized efficiently. Concretely, this device is most suitable for a backlight of a liquid crystal and a green component of an inorganic electroluminescent device using the blue light-emitting layer.

This invention will be explained further in details by showing examples and comparative examples below, but this invention is not limited to the following examples as long as it does not exceed its purpose.

EXAMPLE 1

A $(Sr_{0.756}, Ca_{0.189}, Dy_{0.05}, Eu_{0.005})_2SiO_4$ luminescent material was prepared. As the raw materials thereof, 40.2 g of $SrCO_3$ powder, 6.8 g of $CaCO_3$ powder, 11.4 g of $SiO_2$ powder, 3.4 g of $Dy_2CO_3$ powder, and 0.3 g of $Eu_2CO_3$ powder were prepared. Further, 0.5 g of $NH_4Cl$ was added as a crystal-growing agent to a mixture of these powders and the resultant mixture was uniformly mixed in a ball mill.

The mixed raw material thus obtained was placed in a sintering vessel and sintered in the following sintering conditions. First of all, the mixed raw material was sintered in a reducing atmosphere consisting of $N_2/H_2$ at a temperature ranging from 1100 to 1500° C. for 3-7 hours to obtain a primary sintered product. This primary sintered product was pulverized and placed again in a crucible. The crucible was then placed in a furnace and the interior of the furnace was evacuated and charged with nitrogen gas. The pulverized sintered product was additionally sintered for 2-6 hours at a temperature ranging from 1100 to 1500° C. in a reducing atmosphere consisting of $N_2/H_2$ and containing hydrogen at a concentration of 5% or more and less than 100% to obtain a secondary sintered product. The secondary sintered product thus obtained was pulverized in water and then sieved. The sieved product was dehydrated by suction filtration.

Finally, the resultant product was dried at a temperature of 150° C. in a drying oven and then finally sieved to obtain a luminescent material of this example. When the luminescent material of Example 1 was subjected to quantitative analysis by an ICP emission spectrometric method, the luminescent material of this example was confirmed as having a composition corresponding approximately to the raw materials charged.

Further, the content of each of constituent elements was varied as shown in the following Table 1, thus manufacturing the luminescent materials of Examples 2-10 and Comparative Examples 1 and 2. In the case of the luminescent material of Comparative Example 1, Eu to be employed as the first activator was not incorporated therein. In the case of the luminescent material of Comparative Example 2, Dy to be employed as the second activator was not incorporated therein.

TABLE 1

| | Composition of luminescent material |
|---|---|
| Ex. 2 | $(Sr_{0.885},Ba_{0.060},Dy_{0.05},Eu_{0.005})_2SiO_4$ |
| Ex. 3 | $(Sr_{0.189},Ca_{0.756},Dy_{0.05},Eu_{0.005})_2SiO_4$ |
| Ex. 4 | $(Ba_{0.189},Ca_{0.756},Dy_{0.05},Eu_{0.005})_2SiO_4$ |
| Ex. 5 | $(Ba_{0.851},Ca_{0.095},Dy_{0.05},Eu_{0.005})_2SiO_4$ |
| Ex. 6 | $(Sr_{0.331},Ba_{0.283},Ca_{0.331},Dy_{0.05},Eu_{0.005})_2SiO_4$ |
| Ex. 7 | $(Sr_{0.716},Ca_{0.179},Dy_{0.10},Eu_{0.005})_2SiO_4$ |
| Ex. 8 | $(Sr_{0.759},Ca_{0.190},Dy_{0.05},Eu_{0.001})_2SiO_4$ |
| Ex. 9 | $(Sr_{0.716},Ca_{0.179},Dy_{0.05},Eu_{0.005},Cs_{0.05})_2SiO_4$ |
| Ex. 10 | $(Sr_{0.716},Ca_{0.179},Dy_{0.05},Eu_{0.005},Li_{0.05})_2SiO_4$ |
| Comp. Ex. 1 | $(Sr_{0.76},Ca_{0.19},Dy_{0.05})_2SiO_4$ |
| Comp. Ex. 2 | $(Sr_{0.76},Ba_{0.19},Eu_{0.05})_2SiO_4$ |

As explained above in reference to FIG. 1, when Eu was not incorporated in the luminescent material, the luminescence which was characteristic to Dy was very weak and hence was found unpractical. On the other hand, when Dy was not incorporated in the luminescent material, only the luminescence of broadband originating from Eu was enabled to be confirmed. In any of these cases, it was impossible to obtain an emission peak in a couple of aforementioned specific wavelength regions.

Whereas, in the case of the luminescent materials of Examples, it was possible to obtain both of the narrowband light-emission spectrum and the broadband light-emission spectrum. This can be inferred for example from the emission spectrum of the $(Sr_{0.756}, Ca_{0.189}, Dy_{0.05}, Eu_{0.005})_2SiO_4$ luminescent material of Example 1 shown in FIG. 2.

The luminescent materials of Examples 11-16 and Comparative Example 3 were manufactured in the same manner as described in Example 1 except that the content of each of constituent elements was varied as shown in the following Table 2. Eu was not incorporated in the luminescent material of Comparative Example 3.

TABLE 2

| | Composition of luminescent material |
|---|---|
| Ex. 11 | $(Sr_{0.756},Ca_{0.189},Pr_{0.05},Eu_{0.005})_2SiO_4$ |
| Ex. 12 | $(Sr_{0.189},Ca_{0.756},Pr_{0.05},Eu_{0.005})_2SiO_4$ |
| Ex. 13 | $(Ba_{0.189},Ca_{0.756},Pr_{0.05},Eu_{0.005})_2SiO_4$ |
| Ex. 14 | $(Ba_{0.756},Ca_{0.189},Pr_{0.05},Eu_{0.005})_2SiO_4$ |
| Ex. 15 | $(Sr_{0.758},Ca_{0.190},Pr_{0.05},Eu_{0.005})_2SiO_4$ |
| Ex. 16 | $(Sr_{0.758},Ca_{0.190},Dy_{0.05},Pr_{0.05},Eu_{0.002})_2SiO_4$ |
| Comp. Ex. 3 | $(Sr_{0.885},Ba_{0.060},Pr_{0.05})_2SiO_4$ |

The $(Sr_{0.756}, Ca_{0.189}, Dy_{0.05}, Eu_{0.005})_2SiO_4$ luminescent material of Example 1, a blue luminescent material having a composition of $BaMgAl_{10}O_{17}$:Eu which was available in the market, and a red nitride luminescent material having a composition of $CaAlSiN_3$:Eu which was available in the market were mixed with each other to obtain a mixture of luminescent materials. This mixture of luminescent materials was dispersed in epoxy resin to prepare a resinous mixture.

The resinous mixture thus obtained was used in combination with an LED chip having a peak wavelength of 393 nm, thus manufacturing a white color LED light-emitting device. More specifically, since the LED chip was mounted through a bump as shown in FIG. 18, the white color LED light-emitting device thus obtained was formed of a structure called flip-chip. This white color LED device was identified as Example 17.

FIG. 22 shows a light-emitting spectrum obtained as the content of the luminescent materials of the white color LED light-emitting device of Example 17 was adjusted so as to regulate the color temperature to 3500K. Further, FIG. 23 shows a light-emitting spectrum obtained as the color temperature was adjusted to 4200K. In the case of the white color LED light-emitting device where the color temperature was adjusted to 3500K, an average color rendering index Ra was 98.7. In the case of the white color LED light-emitting device where the color temperature was adjusted to 4200K, an average color rendering index Ra was 96.4. This average color rendering index Ra was determined from the emission spectrum obtained from the white color light-emitting LED device.

Since the average color rendering index Ra was not less than 96, the white color LED light-emitting device of this example was found very high in color rendering, thus enabling it to be practically employed for illumination, etc.

Next, another resinous mixture was prepared in the same manner as described above except that the luminescent material of Example 1 was replaced by the $(Sr_{0.76}, Ba_{0.19}, Eu_{0.05})_2SiO_4$ luminescent material of Comparative Example 2. Then, a white color LED light-emitting device was manufactured in the same manner as described above except that the resinous mixture thus prepared was employed. This white color LED light-emitting device was identified as Comparative Example 4.

Figure 24:
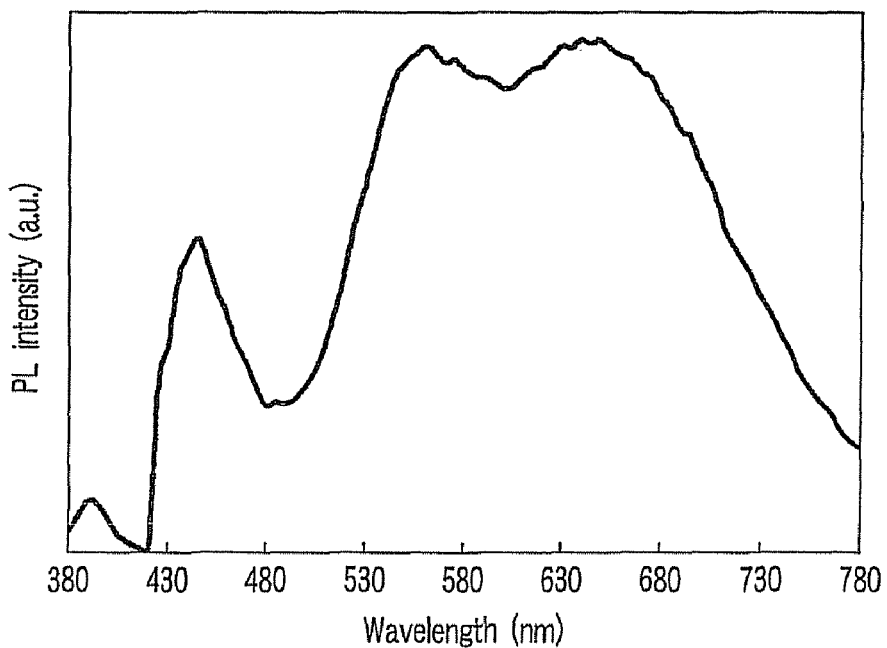
FIG. 24 is a light-emitting spectrum of the white LED wherein a luminescent material of the prior art was employed.
Figure 25:
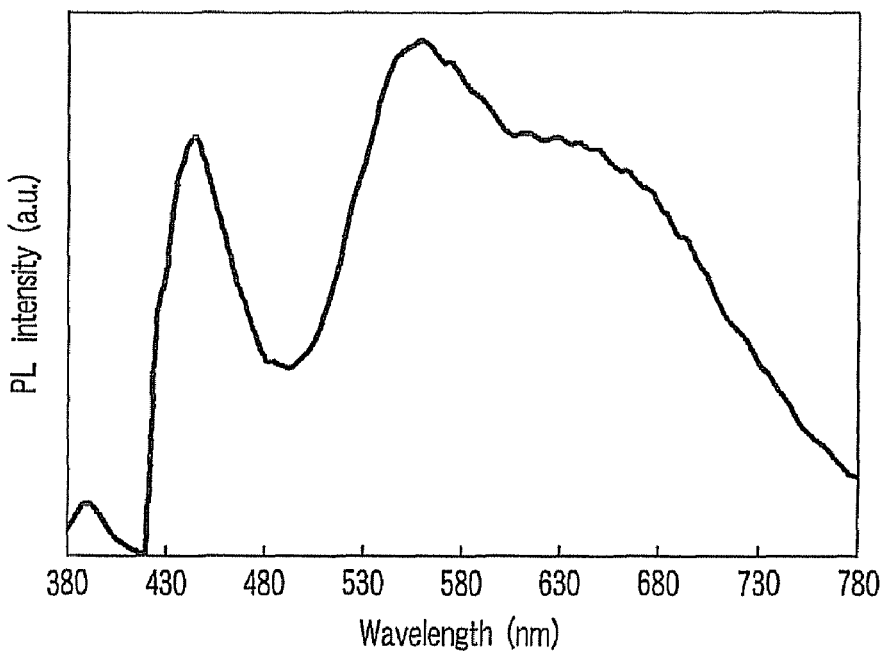
FIG. 25 is a light-emitting spectrum of the white LED wherein a luminescent material of the prior art was employed.

FIG. 24 shows a light-emitting spectrum obtained as the white color LED light-emitting device of Comparative Example 4 was adjusted so as to regulate the color temperature to 3500K. Further, FIG. 25 shows a light-emitting spectrum obtained as the color temperature was adjusted to 4200K. In the case of the white color LED light-emitting device where the color temperature was adjusted to 3500K, an average color rendering index Ra was 84.8. In the case of the white color LED light-emitting device where the color temperature was adjusted to 4200K, an average color rendering index Ra was 82.9.

As apparent from the comparison between Example 17 and Comparative Example 4, the white color LED light-emitting device the luminescent material of Example was employed was more excellent in average color rendering index Ra as compared with the luminescent material of Comparative Example irrespective of the types of white color LED light-emitting device wherein the color temperature was adjusted to 3500K or the color temperature was adjusted to 4200K.

Further, each of the luminescent materials of Examples 2-10, a blue luminescent material and a red luminescent material were employed and then they were used in combination with a near-ultraviolet LED chip as shown in the following Table 3, thus manufacturing the LED light-emitting devices Examples 18-26. More specifically, a luminescent material-containing resin was cast to the LED chip mounted on a frame, thus manufacturing an LED light-emitting device having a shell type structure as shown in FIG. 21.

Furthermore, a green luminescent material having a composition of $BaMgAl_{10}O_{17}$:Mn,Eu, a blue luminescent material, and a red luminescent material were employed in combination with a near-ultraviolet LED chip, thereby manufacturing an LED light-emitting device of Comparative Example 5 in the same manner as described above.

In the LED light-emitting devices of Examples 18-26 and the LED light-emitting device of Comparative Example 5, the content of the luminescent materials was adjusted to regulate the color temperature thereof to 4200 K.

TABLE 3

| | Peak wavelength of exciting light (nm) | Luminescent materials used |
|---|---|---|
| Ex. 18 | 390 | $BaMgAl_{10}O_{17}$:Eu + Ex. 2 + $CaAlSiN_3$:Eu |
| Ex. 19 | 392 | $BaMgAl_{10}O_{17}$:Eu + Ex. 3 + $(Sr,Ca)_2SiO_4$:Eu |
| Ex. 20 | 393 | $BaMgAl_{10}O_{17}$:Eu + Ex. 4 + $(Sr,Ca)_2SiO_4$:Eu |
| Ex. 21 | 393 | $BaMgAl_{10}O_{17}$:Eu + Ex. 5 + $(Sr,Ca)_2SiO_4$:Eu |
| Ex. 22 | 392 | $BaMgAl_{10}O_{17}$:Eu + Ex. 6 + $CaAlSiN_3$:Eu |
| Ex. 23 | 392 | $BaMgAl_{10}O_{17}$:Eu + Ex. 7 + $Sr_2Si_5N_8$:Eu |
| Ex. 24 | 393 | $BaMgAl_{10}O_{17}$:Eu + Ex. 8 + $La_2O_2S$:Eu |
| Ex. 25 | 393 | $BaMgAl_{10}O_{17}$:Eu + Ex. 9 + $CaAlSiN_3$:Eu |
| Ex. 26 | 393 | $BaMgAl_{10}O_{17}$:Eu + Ex. 10 + $CaAlSiN_3$:Eu |
| Comp. Ex. 5 | 393 | $BaMgAl_{10}O_{17}$:Eu + $BaMgAl_{10}O_{17}$:Eu,Mn + $CaAlSiN_3$:Eu |

The average color rendering index Ra of the LED light-emitting devices of Examples 18-26 and of the LED light-emitting device of Comparative Example 5 and the value of chromaticity of the LED light-emitting devices are summarized in the following Table 4. The value of chromaticity of the LED light-emitting device was determined from the emission spectrum which was obtained from the white color LED light-emitting device.

TABLE 4

| | Average color rendering index Ra | Chromaticity of light-emitting device |
|---|---|---|
| Ex. 18 | 91.4 | x = 0.372, y = 0.371 |
| Ex. 19 | 92.9 | x = 0.372, y = 0.371 |
| Ex. 20 | 93.9 | x = 0.372, y = 0.371 |
| Ex. 21 | 94.7 | x = 0.372, y = 0.371 |
| Ex. 22 | 91.4 | x = 0.372, y = 0.371 |
| Ex. 23 | 98.8 | x = 0.372, y = 0.372 |
| Ex. 24 | 93.5 | x = 0.372, y = 0.371 |
| Ex. 25 | 98.5 | x = 0.372, y = 0.372 |
| Ex. 26 | 97.6 | x = 0.372, y = 0.371 |
| Comp. Ex. 5 | 29.8 | x = 0.372, y = 0.372 |

As shown in the above Table 4, while the average color rendering index Ra of the white color LED light-emitting device of Comparative Example was limited to 29.8, the average color rendering index Ra of any of the white color LED light-emitting device of Example was all enhanced to not less than 91. In the case of Example 23 in particular, the average color rendering index Ra thereof was as high as 98.8. This can be attributed to the emission spectrum of the luminescent material which was co-activated by dysprosium and europium in the luminescent material of this example, in particular, to the narrowband light-emission in the vicinity of 490 nm which was effected by dysprosium.

Further, because of the fact that the value of chromaticity was very close to Planckian locus (black body locus), it will be recognized that each of the LED light-emitting device of Examples was one which was capable of emitting white light of high quality.

In the same manner as in the cases of Examples 17-26, each of the luminescent materials of Examples 11-16, a blue luminescent material and a red luminescent material were employed and then they were used in combination with a near-ultraviolet LED chip as shown in the following Table 5, thus manufacturing the LED light-emitting devices of Examples 27-32. More specifically, a luminescent material-containing resin was applied by potting to the LED chip mounted on a frame, thus manufacturing an LED light-emitting device having a surface-mounting type structure as shown in FIG. 19. In the LED light-emitting devices of Examples 27-32, the content of the luminescent materials was adjusted to regulate the color temperature thereof to 4200K.

TABLE 5

| | Peak wavelength of exciting light (nm) | Luminescent materials used |
|---|---|---|
| Ex. 27 | 390 | $BaMgAl_{10}O_{17}$:Eu + Ex. 11 + $CaAlSiN_3$:Eu |
| Ex. 28 | 392 | $BaMgAl_{10}O_{17}$:Eu + Ex. 12 + $(Sr,Ca)_2SiO_4$:Eu |
| Ex. 29 | 393 | $BaMgAl_{10}O_{17}$:Eu + Ex. 13 + $(Sr,Ca)_2SiO_4$:Eu |
| Ex. 30 | 393 | $BaMgAl_{10}O_{17}$:Eu + Ex. 14 + $(Sr,Ca)_2SiO_4$:Eu |
| Ex. 31 | 392 | $BaMgAl_{10}O_{17}$:Eu + Ex. 15 + $(Sr,Ca)_2SiO_4$:Eu |
| Ex. 32 | 392 | $BaMgAl_{10}O_{17}$:Eu + Ex. 16 + $CaAlSiN_3$:Eu |

The average color rendering index Ra of the LED light-emitting devices of Examples 27-32 and the value of chromaticity of the LED light-emitting devices are summarized in the following Table 6. The value of chromaticity of the LED light-emitting device was determined from the emission spectrum which was obtained from the white color LED light-emitting device.

TABLE 6

| | Average color rendering index Ra | Chromaticity of light-emitting device |
|---|---|---|
| Ex. 27 | 94.5 | x = 0.372, y = 0.372 |
| Ex. 28 | 93.2 | x = 0.372, y = 0.371 |
| Ex. 29 | 94.9 | x = 0.372, y = 0.372 |
| Ex. 30 | 93.7 | x = 0.372, y = 0.372 |
| Ex. 31 | 90.5 | x = 0.372, y = 0.371 |
| Ex. 32 | 94.8 | x = 0.372, y = 0.371 |

As shown in the following Table 7, the luminescent material of Example 8, a blue luminescent material having a composition of $BaMgAl_{10}O_{17}$:Eu, and a red luminescent material having a composition of $CaAlSiN_3$:Eu were used in combination with an LED chip having a peak wavelength of 392-394 nm, thus manufacturing LED light-emitting devices of Examples 33-36. Further, the luminescent material of Comparative Example 2, a blue luminescent material, and a red luminescent material were used in combination with an LED chip having a peak wavelength of 392-394 nm, thus manufacturing LED light-emitting devices of Comparative Examples 6-9. More specifically, a luminescent material-containing resin was applied by potting to the LED chip mounted on a frame, thus manufacturing an LED light-emitting device having a surface-mounting type structure as shown in FIG. 19. The content of the luminescent materials was adjusted to regulate the color temperature of LED light-emitting device to 2800, 3500, 5000 or 6500 K.

TABLE 7

|  | Color temp. (K) | Peak wavelength of exciting light (nm) | Luminescent materials used |
| --- | --- | --- | --- |
| Ex. 33 | 2800 | 394 | $BaMgAl_{10}O_{17}$:Eu + Ex. 8 + $CaAlSiN_3$:Eu |
| Ex. 34 | 3500 | 393 | $BaMgAl_{10}O_{17}$:Eu + Ex. 8 + $CaAlSiN_3$:Eu |
| Ex. 35 | 5000 | 392 | $BaMgAl_{10}O_{17}$:Eu + Ex. 8 + $CaAlSiN_3$:Eu |
| Ex. 36 | 6500 | 393 | $BaMgAl_{10}O_{17}$:Eu + Ex. 8 + $CaAlSiN_3$:Eu |
| Comp. Ex. 6 | 2800 | 395 | $BaMgAl_{10}O_{17}$:Eu + Comp. Ex. 2 + $CaAlSiN_3$:Eu |
| Comp. Ex. 7 | 3500 | 392 | $BaMgAl_{10}O_{17}$:Eu + Comp. Ex. 2 + $CaAlSiN_3$:Eu |
| Comp. Ex. 8 | 5000 | 393 | $BaMgAl_{10}O_{17}$:Eu + Comp. Ex. 2 + $CaAlSiN_3$:Eu |
| Comp. Ex. 9 | 6500 | 392 | $BaMgAl_{10}O_{17}$:Eu + Comp. Ex. 2 + $CaAlSiN_3$:Eu |

The average color rendering index Ra of the LED light-emitting devices of Examples 33-36 and of Comparative Examples 6-9 and the value of chromaticity of the LED light-emitting devices are summarized in the following Table 8.

TABLE 8

|  | Average color rendering index Ra | Chromaticity of light-emitting device |
| --- | --- | --- |
| Ex. 33 | 98.0 | x = 0.452, y = 0.409 |
| Ex. 34 | 97.6 | x = 0.405, y = 0.391 |
| Ex. 35 | 93.2 | x = 0.345, y = 0.352 |
| Ex. 36 | 91.4 | x = 0.314, y = 0.324 |
| Comp. Ex. 6 | 89.2 | x = 0.452, y = 0.409 |
| Comp. Ex. 7 | 84.8 | x = 0.405, y = 0.391 |
| Comp. Ex. 8 | 82.7 | x = 0.345, y = 0.352 |
| Comp. Ex. 9 | 82.2 | x = 0.314, y = 0.323 |

As shown in above Table 8, the average color rendering index Ra of the white color LED light-emitting device of Comparative Example was limited to 89 at most. In the case of the white color LED light-emitting devices of Examples, the average color rendering index Ra thereof was all as high as not less than 91. Further, because of the fact that the value of chromaticity was very close to Planckian locus (black body locus), it will be recognized that each of the LED light-emitting device of Examples was one which was capable of emitting white light of high quality.

Additionally, the luminescent materials and an LED chip were combined with each other as shown in the following Table 9, thereby manufacturing the LED light-emitting device of Examples 37 and 38. These LED light-emitting devices were constructed as shown in FIG. 18 and manufactured in the same manner as described above.

TABLE 9

|  | Peak wavelength of exciting light (nm) | Luminescent materials used |
| --- | --- | --- |
| Ex. 37 | 400 | $BaMgAl_{10}O_{17}$:Eu + Ex. 1 + $3.5MgO \cdot 0.5MgF_{10} \cdot GeO_2$:Eu |
| Ex. 38 | 420 | $2SrO \cdot 0.84P_2O_5 \cdot 0.16B_2O_3$:Eu + Ex. 1 + $3.5MgO \cdot 0.5MgF_{10}GeO_2$:Eu |

The average color rendering index Ra of the LED light-emitting devices of Examples 37-38 and the value of chromaticity of the LED light-emitting devices are summarized in the following Table 10.

TABLE 10

|  | Average color rendering index Ra | Chromaticity of light-emitting device |
| --- | --- | --- |
| Ex. 37 | 95.8 | x = 0.372, y = 0.371 |
| Ex. 38 | 97.6 | x = 0.372, y = 0.372 |

As shown in above Table 10, in the case of the white color LED light-emitting devices of these Examples, the average color rendering index Ra thereof was all as high as 95 or more, thus indicating that these light-emitting devices were sufficiently suited for practical use.

According to the embodiment of the present invention, it is possible to provide a luminescent material which is capable of emitting light as it is excited by a light having a major emission peak falling within the range of 310 to 420 nm and to provide the manufacturing method thereof as well as a light-emitting devices using such a luminescent material.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing the luminescent material comprising a light-emitting element emitting light, the light having a main light emission peak in a wavelength ranging from 310 to 420 nm; and a luminescent layer comprising a luminescent material configured to be irradiated with the light, at least part of the luminescent material being a compound having a composition represented by a following general formula (A):

$$(Sr_{a1}, Ba_{b1}, Ca_{c1}, Re_{v1}, Eu_{w1})_2 SiO_4 \qquad (A),$$

wherein, Re is at least one selected from a group consisting of Pr and Dy; and a1, b1, c1, v1 and w1 satisfy following relationships:

$$a1+b1+c1+v1+w1=1 \qquad (1);$$

$$0 \leq a1/(1-v1-w1) \leq 1 \qquad (2);$$

$$0 \leq b1/(1-v1-w1) \leq 1 \qquad (3);$$

$$0 \leq c1/(1-v1-w1) \leq 1 \qquad (4);$$

$$0 < v1 \leq 0.15 \qquad (5);$$

$0 < w1 \leq 0.02$ (6)

$v1/w1 > 1$ (7), the method comprising:

heating a raw material in a reducing atmosphere constituted by $N_2/H_2$ or $Ar/H_2$ at a temperature of 1100 to 1500° C. for 3 to 7 hours to obtain a primary sintered product;

pulverizing the primary sintered product to obtain a pulverized primary sintered product;

housing the pulverized primary sintered product into a container;

arranging the container housing the pulverized primary sintered product to a furnace;

substituting an atmosphere in the furnace with an inert gas; and heating the pulverized primary sintered product in a reducing atmosphere constituted by $N_2/H_2$ or $Ar/H_2$ containing hydrogen at a concentration of 5% or more and less than 100% at a temperature of 1100 to 1500° C. for 2 to 6 hours to obtain a secondary sintered product.

2. A method for manufacturing a luminescent material comprising a compound having a composition represented by the following general formula (B):

$(Sr_{a2},Ba_{b2},Ca_{c2},Re_{v2},Eu_{w2},M_{v2})_2SiO_4$ (B), wherein, Re is at least one selected from a group consisting of Pr and Dy; M is at least one selected from a group consisting of Li, Na, K, Rb and Cs; and a2, b2, c2, v2 and w2 satisfy following relationships:

$a2+b2+c2+2v2+w2=1$ (7);

$0 \leq a2/(1-2v2-w2) \leq 1$ (8);

$0 \leq b2/(1-2v2-w2) \leq 1$ (9);

$0 \leq c2/(1-2v2-w2) \leq 1$ (10);

$0 < v2 \leq 0.15$ (11);

$0 < w2 \leq 0.02$ (12)

$v2/w2 > 1$ (13), the method comprising:

heating a raw material in a reducing atmosphere constituted by $N_2/H_2$ or $Ar/H_2$ at a temperature of 1100 to 1500° C. for 3 to 7 hours to obtain a primary sintered product;

pulverizing the primary sintered product to obtain a pulverized primary sintered product;

housing the pulverized primary sintered product into a container;

arranging the container housing the pulverized primary sintered product to a furnace;

substituting an atmosphere in the furnace with an inert gas; and heating the pulverized primary sintered product in a reducing atmosphere constituted by $N_2/H_2$ or $Ar/H_2$ containing hydrogen at a concentration of 5% or more and less than 100% at a temperature of 1100 to 1500° C. for 2 to 6 hours to obtain a secondary sintered product.

3. A light-emitting device, comprising:

a light-emitting element emitting light, the light having a main light emission peak in a wavelength ranging from 310 to 420 nm; and a luminescent layer comprising a luminescent material configured to be irradiated with the light, at least part of the luminescent material being a compound having a composition represented by a following general formula (A):

$(Sr_{a1},Ba_{b1},Ca_{c1},Re_{v1},Eu_{w1})_2SiO_4$ (A), wherein, Re is at least one selected from a group consisting of Pr and Dy; and a1, b1, c1, v1 and w1 satisfy following relationships:

$a1+b1+c1+v1+w1=1$ (1);

$0 \leq a1/(1-v1-w1) \leq 1$ (2);

$0 \leq b1/(1-v1-w1) \leq 1$ (3);

$0 \leq c1/(1-v1-w1) \leq 1$ (4);

$0 < v1 \leq 0.15$ (5);

$0 < w1 \leq 0.02$ (6)

$v1/w1 > 1$ (7), wherein the luminescent layer comprises another luminescent material having a main light emission peak in a wavelength ranging from 430 to 510 nm.

4. A light-emitting device comprising:

a light-emitting element emitting light, the light having a main light emission peak in a wavelength ranging from 310 to 420 nm; and a luminescent layer comprising a luminescent material configured to be irradiated with the light, at least part of the luminescent material being a compound having a composition represented by the following general formula (B):

$(sr_{a2},Ba_{b2},Ca_{c2},Re_{v2},Eu_{w2},M_{v2})_2SiO_4$ (B), wherein, Re is at least one selected from a group consisting of Pr and Dy; M is at least one selected from a group consisting of Li, Na, K, Rb and Cs; and a2, b2, c2, v2 and w2 satisfy following relationships:

$a2+b2+c2+2v2+w2=1$ (7);

$0 \leq a2/(1-2v2-w2) \leq 1$ (8);

$0 \leq b2/(1-2v2-w2) \leq 1$ (9);

$0 \leq c2/(1-2v2-w2) \leq 1$ (10);

$0 < v2 \leq 0.15$ (11);

$0 < w2 \leq 0.02$ (12)

$v2/w2 > 1$ (13), wherein the luminescent layer comprises another luminescent material having a main light emission peak in a wavelength ranging from 430 to 510 nm.

* * * * *